United States Patent
Shimazawa et al.

(10) Patent No.: US 7,739,787 B2
(45) Date of Patent: Jun. 22, 2010

(54) METHOD OF MANUFACTURING A MAGNETORESISTIVE ELEMENT

(75) Inventors: Koji Shimazawa, Tokyo (JP); Yoshihiro Tsuchiya, Tokyo (JP); Tomohito Mizuno, Tokyo (JP); Daisuke Miyauchi, Tokyo (JP); Shinji Hara, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 679 days.

(21) Appl. No.: 11/715,341

(22) Filed: Mar. 8, 2007

(65) Prior Publication Data

US 2007/0242396 A1    Oct. 18, 2007

(30) Foreign Application Priority Data

Apr. 14, 2006    (JP)    ............... 2006-112281

(51) Int. Cl.
*G11B 5/127*    (2006.01)
*H04R 31/00*    (2006.01)

(52) U.S. Cl. ............... 29/603.16; 29/603.07; 29/603.13; 29/603.15; 29/603.18; 216/22; 216/48; 360/324.1; 360/324.11; 360/324.12; 427/127; 427/128; 427/131

(58) Field of Classification Search ............... 29/603.07, 29/603.13–603.16, 603.18; 216/22, 48; 360/324.1, 360/324.11, 324.12; 427/127–131
See application file for complete search history.

(56) References Cited

U.S. PATENT DOCUMENTS 5,528,440 A    6/1996  Fontana et al.
7,310,207 B2 *  12/2007 Hasegawa et al. ...... 360/324.11
7,336,453 B2 *   2/2008 Hasegawa et al. ...... 360/324.12
7,535,682 B2 *   5/2009 Shimazawa et al. ...... 360/324.1
2003/0073778 A1  4/2003 Zhang et al.
2003/0137785 A1  7/2003 Saito
2005/0073778 A1  4/2005 Hasegawa et al.

FOREIGN PATENT DOCUMENTS

| JP | A-08-45032   | 2/1996  |
| JP | A-09-288807  | 11/1997 |
| JP | A-2003-218428 | 7/2003 |
| JP | A-2005-116703 | 4/2005 |

OTHER PUBLICATIONS

K. Nagasaka et al., "Giant Magnetoresistance Properties of Spin Valve Films in Current-Perpendicular-To-Plane Geometry", Journal of the Magnetic Society of Japan, vol. 25, No. 4-2, (2001) pp. 807-810.

J. A. Caballero et al., "Effect of Deposition Parameters on the CPP-GMR of NiMnSb-Based Spin-Valve Structures", Journal of Magnetism and Magnetic Materials, vols. 198-199, (1999) pp. 55-57.

* cited by examiner

*Primary Examiner*—Paul D Kim
(74) *Attorney, Agent, or Firm*—Oliff & Berridge, PLC

(57) ABSTRACT

In an MR element, each of a pinned layer and a free layer includes a Heusler alloy layer. The Heusler alloy layer has two surfaces that are quadrilateral in shape and face toward opposite directions. The Heusler alloy layer includes one crystal grain that touches four sides of one of the two surfaces. In a method of manufacturing the MR element, a layered film to be the MR element is formed and patterned, and then heat treatment is performed on the layered film patterned, so that crystal grains included in a film to be the Heusler alloy layer in the layered film grow and one crystal grain that touches four sides of one of the surfaces of the film to be the Heusler alloy layer is thereby formed.

5 Claims, 21 Drawing Sheets

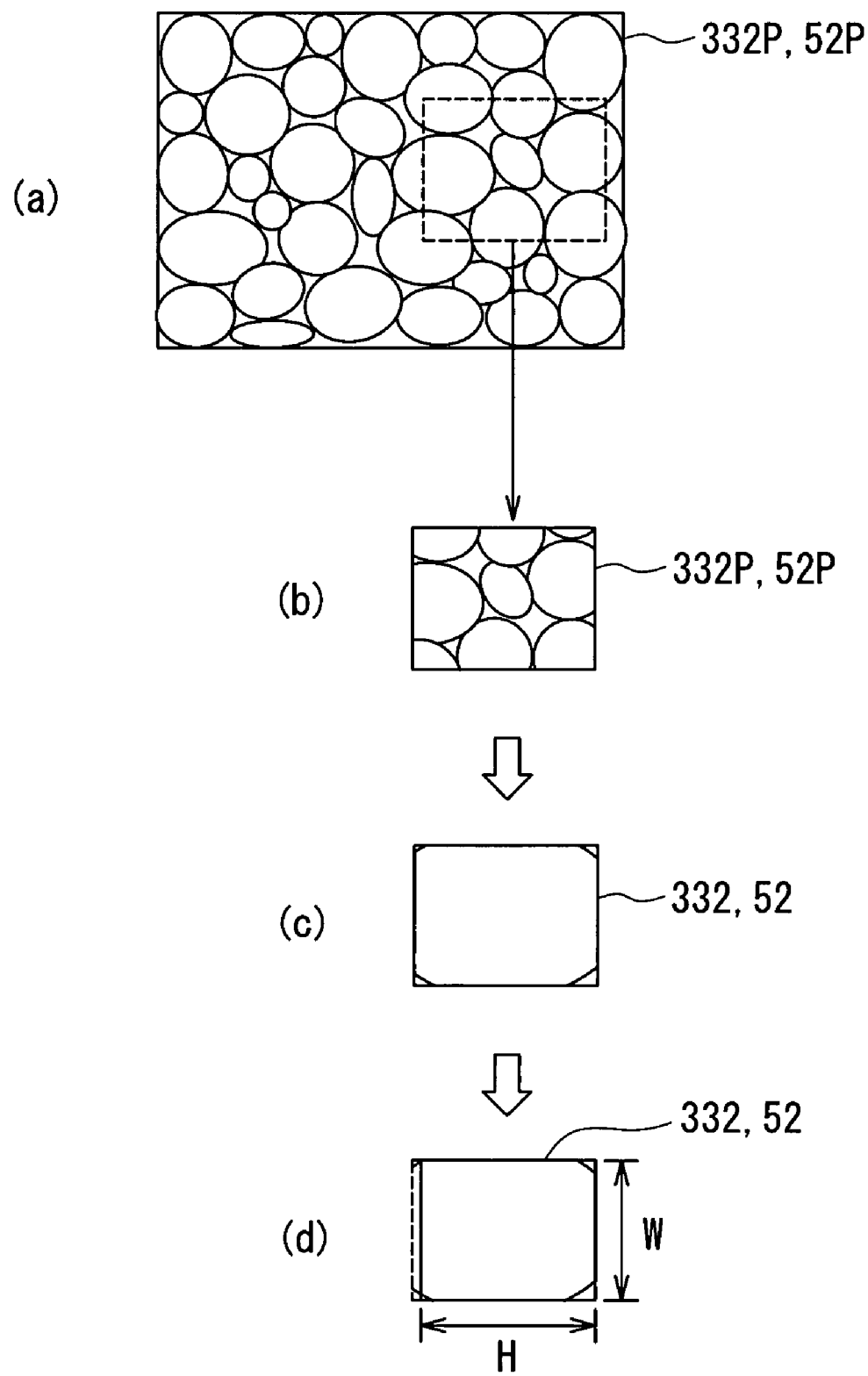
F I G. 21

METHOD OF MANUFACTURING A MAGNETORESISTIVE ELEMENT

BACKGROUND OF THE INVENTION

1. Field of the Invention

The present invention relates to a magnetoresistive element and a method of manufacturing the same and a magnetoresistive element aggregate used for manufacturing the magnetoresistive element, and to a thin-film magnetic head, a head gimbal assembly, a head arm assembly and a magnetic disk drive each of which incorporates the magnetoresistive element.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write (recording) head having an induction-type electromagnetic transducer for writing and a read (reproducing) head having a magnetoresistive (MR) element for reading are stacked on a substrate.

MR elements include giant magnetoresistive (GMR) elements utilizing a giant magnetoresistive effect, and tunnel magnetoresistive (TMR) elements utilizing a tunnel magnetoresistive effect.

It is required that the characteristics of a read head include high sensitivity and high output capability. GMR heads incorporating spin-valve GMR elements have been mass-produced as read heads that satisfy such requirements. Recently, developments have been made for read heads using TMR elements to adapt to further improvements in areal recording density.

Typically, a spin-valve GMR element incorporates: a nonmagnetic conductive layer having two surfaces facing toward opposite directions; a free layer disposed adjacent to one of the surfaces of the nonmagnetic conductive layer; a pinned layer disposed adjacent to the other of the surfaces of the nonmagnetic conductive layer; and an antiferromagnetic layer disposed adjacent to one of the surfaces of the pinned layer farther from the nonmagnetic conductive layer. The free layer is a ferromagnetic layer in which the direction of magnetization changes in response to a signal magnetic field. The pinned layer is a ferromagnetic layer in which the direction of magnetization is fixed. The antiferromagnetic layer is a layer that fixes the direction of magnetization in the pinned layer by means of exchange coupling with the pinned layer.

Conventional GMR heads have a structure in which a current used for detecting magnetic signals (that is hereinafter called a sense current) is fed in the direction parallel to the plane of each layer making up the GMR element. Such a structure is called a current-in-plane (CIP) structure. A GMR element used for read heads having the CIP structure is hereinafter called a CIP-GMR element.

In a read head having the CIP structure, the CIP-GMR element is disposed between two shield layers made of soft magnetic metal films and disposed on the top and bottom of the CIP-GMR element. A shield gap film made of an insulating film is disposed between the CIP-GMR element and the respective shield layers. In this read head the linear recording density is determined by the space between the two shield layers (hereinafter called a read gap length).

With an increase in recording density, there have been increasing demands for reductions in read gap length and track width. In read heads a reduction in track width is achieved by a reduction in width of the MR element. As the width of the MR element is reduced, the length of the MR element taken in a direction orthogonal to the medium facing surface of the thin-film magnetic head is also reduced. As a result, the areas of the bottom and top surfaces of the MR element decrease.

In the read head having the CIP structure, since the CIP-GMR element is isolated from the shield layers by the respective shield gap films, the heat release efficiency decreases if the areas of the bottom and top surfaces of the MR element decrease. Consequently, there arises a problem that, in this type of read head, the operating current is limited to secure the reliability.

On the other hand, as disclosed in JP 9-288807A, for example, there have also been proposed GMR heads each having a structure in which a sense current is fed in a direction intersecting the plane of each layer making up the GMR element, such as the direction perpendicular to the plane of each layer making up the GMR element. Such a structure is called a current-perpendicular-to-plane (CPP) structure. A GMR element used for read heads having the CPP structure is hereinafter called a CPP-GMR element.

A read head having the CPP structure requires no shield gap film, wherein electrode layers touch the bottom and top surfaces of the CPP-GMR element, respectively. The electrode layers may also function as the shield layers. The read head having the CPP structure is capable of solving the problem of the read head having the CIP structure previously described. That is, the read head having the CPP structure exhibits a good heat release efficiency since the electrode layers touch the bottom and top surfaces of the CPP-GMR element, respectively. It is therefore possible to increase the operating current of this read head. Furthermore, in the read head, the smaller the areas of the bottom and top surfaces of the CPP-GMR element, the higher is the resistance of the element and the greater is the magnetoresistance change amount. It is therefore possible to reduce the track width of the read head. Furthermore, it is also possible to reduce the read gap length of the read head. The foregoing concludes that the CPP structure is a technique requisite for achieving an areal recording density greater than 200 gigabits per square inches.

A read head incorporating the TMR element mentioned previously has the CPP structure, too. Typically, the TMR element incorporates: a tunnel barrier layer having two surfaces facing toward opposite directions; a free layer disposed adjacent to one of the surfaces of the tunnel barrier layer; a pinned layer disposed adjacent to the other of the surfaces of the tunnel barrier layer; and an antiferromagnetic layer disposed adjacent to one of the surfaces of the pinned layer farther from the tunnel barrier layer. The tunnel barrier layer is a nonmagnetic insulating layer that allows electrons to pass therethrough while maintaining the spin by means of the tunnel effect. The free layer, the pinned layer and the antiferromagnetic layer of the TMR element are the same as those of a spin-valve GMR element.

A practical CPP-GMR element is disclosed in Nagasaka et al., "Giant Magnetoresistance Properties of Spin Valve Films in Current-perpendicular-to-plane Geometry", Journal of the Magnetics Society of Japan, vol. 25, no. 4-2, pp. 807-810, 2001. The configuration of films of a sample called S-1 listed on Table 1 of Nagasaka et al. will now be described as an example of configuration of films of the CPP-GMR element disclosed in this article. Sample S-1 has a film configuration of a single spin-valve type, incorporating a free layer, a nonmagnetic conductive layer, a pinned layer and an antiferromagnetic layer that are stacked in this order on a lower electrode. An upper electrode is disposed on the antiferromagnetic layer. The free layer is formed by stacking an NiFe layer and a CoFeB layer. The nonmagnetic conductive layer is made of Cu. The pinned layer is formed by stacking a CoFeB layer, an Ru layer and a CoFeB layer. The antiferromagnetic layer is made of PdPtMn. According to Table 2 of Nagasaka et al., the magnetoresistance change ratio (hereinafter called MR ratio), which is a ratio of magnetoresistance change with respect to the resistance, of sample S-1 is approximately 1.16 percent. Considering practical utilization of the read head, this value of MR ratio is insufficient since it is impossible to increase the output of the read head.

Nagasaka at al. also disclose the film configuration of a dual spin-valve type. With this film configuration, it is possible to make the MR ratio higher, compared with the film configuration of the single spin-valve type. However, the film configuration of the dual spin-valve type has a problem that the read gap length increases.

It is assumed that the reason why the MR ratio of conventional CPP-GMR elements such as the above-mentioned element is low is that the spin polarization of an Fe-based or Co-based material used as the material of the pinned layer and the free layer is low.

To increase the MR ratio, it has been proposed recently to employ CPP-GMR elements in which a half metal whose spin polarization is nearly 1 is used as the material of ferromagnetic films included in the pinned layer and the free layer. Typically, the MR ratio and the magnetoresistance change amount of a CPP-GMR element increase with increasing spin polarization of the ferromagnetic films included in the pinned layer and the free layer. It is assumed that the reason is as follows. If the spin polarization of a ferromagnetic film increases, the density of states in a neighborhood of Fermi energy of one spin increases in the ferromagnetic film while the density of states in a neighborhood of Fermi energy of the other spin decreases. As a result, it is assumed that the difference between the mean free path of conduction electrons of the one spin and the mean free path of conduction electrons of the other spin increases, and the MR ratio and the magnetoresistance change amount thereby increase. The spin polarization of ferromagnetic metal films included in the pinned layer and the free layer of a conventional CPP-GMR element is about 0.3 to 0.5, which is much smaller than the spin polarization of a half metal, which is nearly 1.

A CPP-GMR element using a Heusler alloy, which is a type of half metal, is disclosed in Journal of Magnetism and Magnetic Materials, vols. 198-199, pp. 55-57, Jun. 1, 1999. The MR ratio of the CPP-GMR element disclosed in this article is about 8 percent at 4.2 K.

The Heusler alloy will now be briefly described. The Heusler alloy is a term generally used for ordered alloys having a chemical composition of XYZ or $X_2YZ$. An ordered alloy having a chemical composition of XYZ is called a half Heusler alloy. An ordered alloy having a chemical composition of $X_2YZ$ is called a full Heusler alloy. Here, X is an element selected from the group consisting of the transition metals of the Fe family, the Co family, the Ni family and the Cu family of the periodic table, and the noble metals. Y is at least one element selected from the group consisting of Fe and the transition metals of the Ti family, the V family, the Cr family and the Mn family of the periodic table. Z is at least one element selected from the group consisting of the typical elements of the periods from the third to fifth periods inclusive of the periodic table. It is assumed that emergence of ferromagnetism in a Heusler alloy results from the RKKY interaction due to an orderly arrangement of magnetic moments of the element Y.

JP 2003-218428A discloses a CPP-GMR element in which at least one of the pinned layer and the free layer includes a Heusler alloy layer made of $Co_2MnZ$, where Z is one or two elements selected from the group consisting of Al, Si, Ga, Ge and Sn.

JP 2005-116703A discloses a CPP-GMR element in which at least one of the pinned layer and the free layer includes a Heusler alloy layer. JP 2005-116703A discloses that the mean crystal grain diameter taken in the direction parallel to the plane of the Heusler alloy layer is preferably 50 Å (5 nm) or greater, and more preferably 100 Å (10 nm) or greater. In addition, JP 2005-116703A discloses an example in which, after the Heusler alloy layer is formed, heat treatment is performed at 290° C. for four hours to make the Heusler alloy layer form a superlattice.

As disclosed in JP 2005-116703A, for TMR elements, it is also expected that a high MR ratio will be achieved by employing a Heusler alloy as the material of ferromagnetic films included in the pinned layer and/or the free layer.

JP 8-045032A discloses a method of manufacturing a spin-valve GMR element that will now be described. In the method, a spin-valve film is patterned to have a width corresponding to the track width, and a ferromagnetic layer and a layer that exhibits antiferromagnetism when heated are stacked on both sides of the spin-valve film, the sides being opposed to each other in the direction of track width, which is followed by heating the layer that exhibits antiferromagnetism when heated up to a temperature of about 240° C. so as to be transferred to be antiferromagnetic.

An MR element including a Heusler alloy layer has a benefit that it is possible to obtain a high MR ratio resulting from a high spin polarization of the Heusler alloy layer but also has a problem that variations in characteristics such as the MR ratio are great.

Reference is now made to FIG. 27(a) to FIG. 27(d) to describe the reason why such variations in characteristics occur. Typically, a Heusler alloy layer is formed by making a film to be the Heusler alloy layer and then performing heat treatment on this film to change the crystal structure of the film into a structure that achieves a high spin polarization. However, in this heat treatment process, a plurality of crystal grains in the film also grow. FIG. 27(a) schematically illustrates the state of crystal grains in the top surface of a film to be a Heusler alloy layer immediately after the film is formed. FIG. 27(b) schematically illustrates the state of the crystal grains in the top surface of the film after the heat treatment. As shown in FIG. 27(a) and FIG. 27(b), variations in size of the crystal grains in the film after the heat treatment are greater than variations in size of the crystal grains in the film immediately after the film is formed. A film having a thickness of 100 nm to be a Heusler alloy layer was actually formed and heat treatment was given to this film. As a result, it was confirmed that the diameters of typical crystal grains in the film after the heat treatment were distributed in a wide range of about 5 to 200 nm.

An MR element is fabricated by forming a layered film that will be patterned later to be the MR element, and then patterning this layered film. In the case of fabricating an MR element including a Heusler alloy layer, the layered film before undergoing patterning includes a film to be the Heusler alloy layer. On this film, heat treatment is performed after the layered film is formed, for example. In this case, in the layered film before undergoing patterning, the film to be the Heusler alloy layer is in the state illustrated in FIG. 27(b). When the layered film is patterned, the film to be the Heusler alloy layer shown in FIG. 27(b) is pattered to have the shape as shown in FIG. 27(c) and FIG. 27(d), for example. The film thus patterned is the Heusler alloy layer. Here, as shown in FIG. 27(b), since variations in size of crystal grains in the film after the heat treatment are great, there also occur variations in the number and size of crystal grains in the Heusler alloy layer obtained by patterning the film, as shown in FIG. 27(c) and FIG. 27(d). In the example shown in FIG. 27(a) to FIG. 27(d), the Heusler alloy layer of FIG. 27(d) has a greater number of small crystal grains than the Heusler alloy layer of FIG. 27(c), and the sum of surface areas of the grain boundaries are therefore greater in the Heusler alloy layer of FIG. 27(d). In this case, an MR element including the Heusler alloy layer of FIG. 27(d) has a lower MR ratio, compared with an MR element including the Heusler alloy layer of FIG. 27(c). As thus described, it is assumed that variations in the number and size of crystal grains in a Heusler alloy layer are the cause of variations in characteristics of an MR element including the Heusler alloy layer.

OBJECT AND SUMMARY OF THE INVENTION

It is an object of the invention to provide a magnetoresistive element in which a current is fed in a direction intersecting the plane of each layer making up the magnetoresistive element, the magnetoresistive element having a great magnetoresistance change ratio and small variations in characteristics, and to provide a method of manufacturing such a magnetoresistive element, a magnetoresistive element aggregate used for manufacturing the magnetoresistive element, and a thin-film magnetic head, a head gimbal assembly, a head arm assembly and a magnetic disk drive each of which incorporates the magnetoresistive element.

A magnetoresistive element of the invention incorporates: a nonmagnetic layer having a first surface and a second surface that face toward opposite directions; a pinned layer disposed adjacent to the first surface of the nonmagnetic layer, a direction of magnetization in the pinned layer being fixed; and a free layer disposed adjacent to the second surface of the nonmagnetic layer, a direction of magnetization in the free layer changing in response to an external magnetic field. In the magnetoresistive element of the invention, a current for detecting magnetic signals is fed in a direction intersecting the plane of each of the layers that make up the magnetoresistive element.

In the magnetoresistive element of the invention, at least one of the pinned layer and the free layer includes a Heusler alloy layer made of a Heusler alloy and having two surfaces that are quadrilateral in shape and face toward opposite directions. The Heusler alloy layer includes one crystal grain that touches four sides of one of the two surfaces of the Heusler alloy layer.

A magnetoresistive element aggregate of the invention is used for manufacturing the magnetoresistive element of the invention. The magnetoresistive element aggregate of the invention incorporates a plurality of pre-element portions that include portions to be the respective magnetoresistive elements and that will be separated from one another later. In each of the pre-element portions, at least one of the pinned layer and the free layer includes a Heusler alloy layer made of a Heusler alloy and having two surfaces that are quadrilateral in shape and face toward opposite directions, and the Heusler alloy layer includes one crystal grain that touches four sides of one of the two surfaces of the Heusler alloy layer.

According to the magnetoresistive element or the magnetoresistive element aggregate of the invention, since at least one of the pinned layer and the free layer includes a Heusler alloy layer, it is possible to increase the magnetoresistance change ratio of the magnetoresistive element. Furthermore, according to the magnetoresistive element or the magnetoresistive element aggregate of the invention, since the Heusler alloy layer includes one crystal grain that touches the four sides of one of the two surfaces of the Heusler alloy layer, variations in characteristics of the magnetoresistive element are reduced.

A method of manufacturing a magnetoresistive element according to the invention is provided for the manufacture of the magnetoresistive element of the invention. The method includes the steps of forming a layered film that will be the magnetoresistive element after undergoing patterning and heat treatment, the layered film including a film to be the pinned layer, a film to be the nonmagnetic layer, and a film to be the free layer, wherein at least one of the film to be the pinned layer and the film to be the free layer includes a film to be the Heusler alloy layer; patterning the layered film so that the film to be the Heusler alloy layer has two surfaces that are quadrilateral in shape and face toward opposite directions; and performing the heat treatment on the layered film after the step of patterning, so that crystal grains included in the film to be the Heusler alloy layer grow and one crystal grain that touches four sides of one of the two surfaces of the film to be the Heusler alloy layer is thereby formed.

According to the method of manufacturing a magnetoresistive element of the invention, at least one of the pinned layer and the free layer of the magnetoresistive element manufactured is made to include a Heusler alloy layer, and the Heusler alloy layer is made to include one crystal grain that touches the four sides of one of the two surfaces of the Heusler alloy layer.

In the magnetoresistive element, the magnetoresistive element aggregate or the method of manufacturing a magnetoresistive element of the invention, the one of the two surfaces of the Heusler alloy layer may be rectangular in shape, and a longer one of the sides of the one of the two surfaces may have a length equal to or smaller than 200 nm. The one of the two surfaces of the Heusler alloy layer may have an area equal to or smaller than 10000 $nm^2$.

In the magnetoresistive element, the magnetoresistive element aggregate or the method of manufacturing a magnetoresistive element of the invention, the nonmagnetic layer may be made of a conductive material or may be a tunnel barrier layer made of an insulating material.

A thin-film magnetic head of the invention incorporates: a medium facing surface that faces toward a recording medium; the magnetoresistive element of the invention disposed near the medium facing surface to detect a signal magnetic field sent from the recording medium; and a pair of electrodes for feeding a current for detecting magnetic signals to the magnetoresistive element in a direction intersecting the plane of each layer making up the magnetoresistive element.

A head gimbal assembly of the invention incorporates: a slider including the thin-film magnetic head of the invention and disposed to face toward a recording medium; and a suspension flexibly supporting the slider. A head arm assembly of the invention incorporates: a slider including the thin-film magnetic head of the invention and disposed to face toward a recording medium; a suspension flexibly supporting the slider; and an arm for making the slider travel across tracks of the recording medium, the suspension being attached to the arm.

A magnetic disk drive of the invention incorporates: a slider including the thin-film magnetic head of the invention and disposed to face toward a recording medium that is driven to rotate; and an alignment device supporting the slider and aligning the slider with respect to the recording medium.

According to the magnetoresistive element or the magnetoresistive element aggregate of the invention, since at least one of the pinned layer and the free layer includes a Heusler alloy layer, it is possible to increase the magnetoresistance change ratio of the magnetoresistive element. Furthermore, according to the magnetoresistive element or the magnetoresistive element aggregate of the invention, since the Heusler alloy layer includes one crystal grain that touches the four sides of one of the two surfaces of the Heusler alloy layer, it is possible to reduce variations in characteristics of the magnetoresistive element.

According to the method of manufacturing a magnetoresistive element of the invention, since at least one of the pinned layer and the free layer of the magnetoresistive element manufactured includes a Heusler alloy layer, it is possible to increase the magnetoresistance change ratio of the magnetoresistive element. Furthermore, according to the method of the invention, since the Heusler alloy layer is made to include one crystal grain that touches the four sides of one of the two surfaces of the Heusler alloy layer, it is possible to reduce variations in characteristics of the magnetoresistive element.

Other and further objects, features and advantages of the invention will appear more fully from the following description.

BRIEF DESCRIPTION OF THE DRAWINGS

FIG. 21 is a view for illustrating changes in a film to be a Heusler alloy layer and the Heusler alloy layer of the first embodiment of the invention.

DETAILED DESCRIPTION OF THE PREFERRED EMBODIMENTS

First Embodiment

Figure 3:
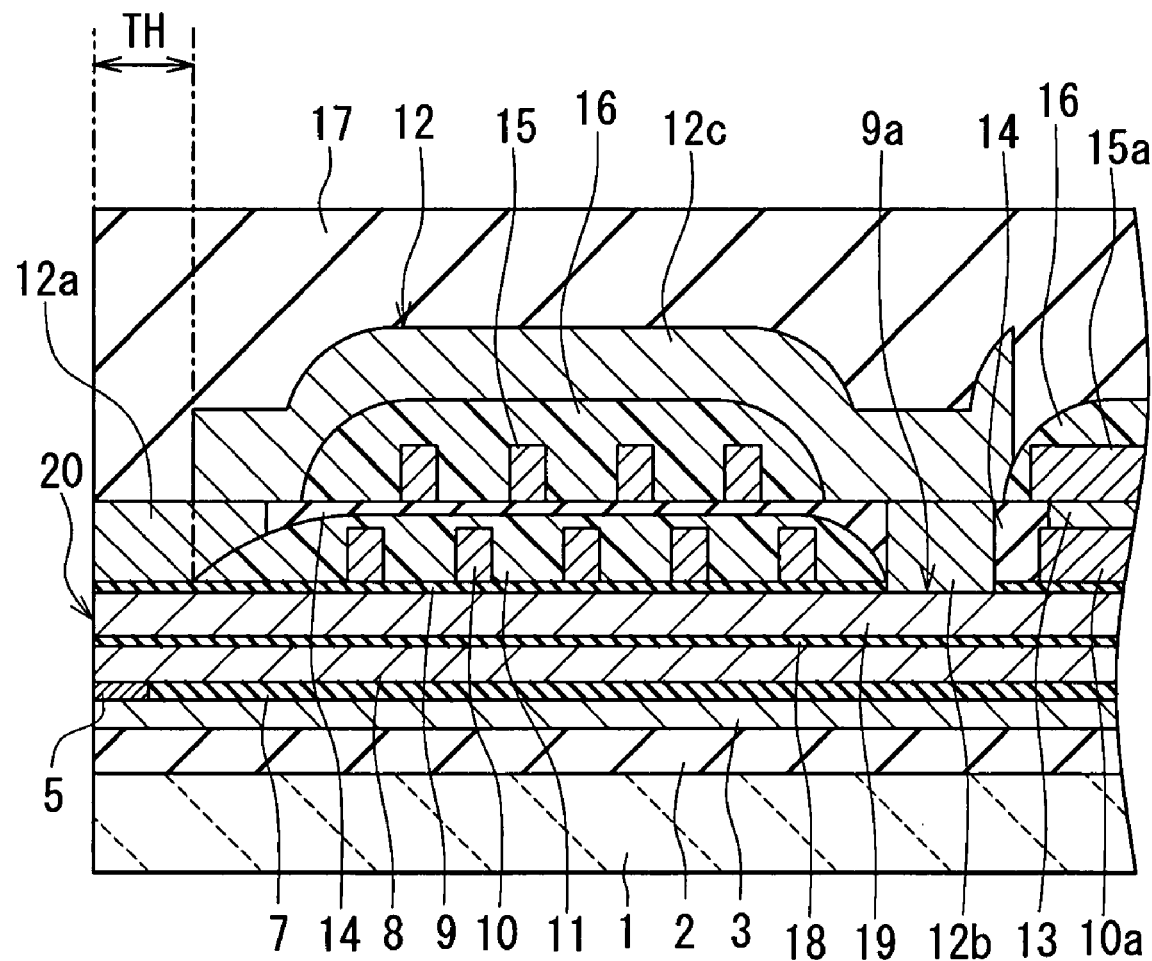
FIG. 3 is a cross-sectional view of a thin-film magnetic head of the first embodiment of the invention, wherein the cross section is orthogonal to the medium facing surface and the top surface of the substrate.
Figure 4:
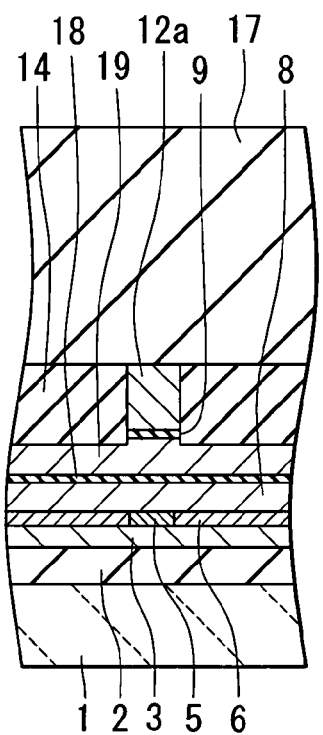
FIG. 4 is a cross-sectional view of the pole portion of the thin-film magnetic head of the first embodiment of the invention, wherein the cross section is parallel to the medium facing surface.

Preferred embodiments of the invention will now be described in detail with reference to the accompanying drawings. Reference is now made to FIG. 3 and FIG. 4 to describe the outlines of the configuration and a manufacturing method of a thin-film magnetic head of a first embodiment of the invention. FIG. 3 illustrates a cross section of the thin-film magnetic head orthogonal to a medium facing surface and the top surface of a substrate. FIG. 4 illustrates a cross section of a pole portion of the thin-film magnetic head parallel to the medium facing surface.

In the method of manufacturing the thin-film magnetic head of the embodiment, first, an insulating layer 2 made of an insulating material such as alumina ($Al_2O_3$) and having a thickness of 1 to 5 μm, for example, is formed by a method such as sputtering on a substrate 1 made of a ceramic such as aluminum oxide and titanium carbide ($Al_2O_3$—TiC). Next, a first shield layer 3 for a read head having a specific pattern and made of a magnetic material such as NiFe or FeAlSi is formed on the insulating layer 2 by a method such as plating. Next, although not shown, an insulating layer of alumina, for example, is formed over the entire surface. Next, the insulating layer is polished by chemical mechanical polishing (CMP), for example, so that the first shield layer 3 is exposed, and the top surfaces of the first shield layer 3 and the insulating layer are thereby flattened.

Next, on the first shield layer 3, there are formed an MR element 5 for reading, two bias field applying layers 6 located adjacent to two sides of the MR element 5 with an insulating film (not shown) disposed in between, and an insulating layer 7 disposed around the MR element 5 and the bias field applying layers 6. The insulating film not shown and the insulating layer 7 are made of an insulating material such as alumina.

Next, a second shield layer 8 for the read head is formed on the MR element 5, the bias field applying layers 6 and the insulating layer 7. The second shield layer 8 is made of a magnetic material and may be formed by plating or sputtering, for example. Next, a separating layer 18 made of a nonmagnetic material such as alumina is formed by sputtering, for example, on the second shield layer 8. Next, a bottom pole layer 19 provided for a write head and made of a magnetic material is formed on the separating layer 18 by plating or sputtering, for example. The magnetic material used for the second shield layer 8 and the bottom pole layer 19 is a soft magnetic material such as NiFe, CoFe, CoFeNi or FeN. Alternatively, a second shield layer that also functions as a bottom pole layer may be provided in place of the second shield layer 8, the separating layer 18 and the bottom pole layer 19.

Next, a write gap layer 9 made of a nonmagnetic material such as alumina and having a thickness of 50 to 300 nm, for example, is formed on the bottom pole layer 19 by a method such as sputtering. Next, to make a magnetic path, a portion of the write gap layer 9 is etched to form a contact hole 9a in a center portion of a thin-film coil described later.

Next, a first layer portion 10 of the thin-film coil made of copper (Cu), for example, and having a thickness of 2 to 3 μm, for example, is formed on the write gap layer 9. In FIG. 3 numeral 10a indicates a connecting portion of the first layer portion 10 connected to a second layer portion 15 of the thin-film coil described later. The first layer portion 10 is wound around the contact hole 9a.

Next, an insulating layer 11 having a specific pattern is formed to cover the first layer portion 10 of the thin-film coil and the write gap layer 9 disposed around the first layer portion 10. The insulating layer 11 is made of an organic insulating material that exhibits fluidity when heated, such as photoresist. Next, heat treatment is performed at a specific temperature to flatten the surface of the insulating layer 11. Through this heat treatment, each of the outer and inner edge portions of the insulating layer 11 is made to have a shape of rounded sloped surface.

Next, a track width defining layer 12a of a top pole layer 12 made of a magnetic material for the write head is formed on regions of the write gap layer 9 and the insulating layer 11, the regions extending from a sloped portion of the insulating layer 11 closer to a medium facing surface 20 described later toward the medium facing surface 20. The top pole layer 12 is made up of the track width defining layer 12a, and a coupling portion layer 12b and a yoke portion layer 12c that will be described later.

The track width defining layer 12a has: a tip portion that is formed on the write gap layer 9 and functions as the pole portion of the top pole layer 12; and a connecting portion that is formed on the sloped portion of the insulating layer 11 closer to the medium facing surface 20 and is connected to the yoke portion layer 12c. The tip portion has a width equal to the write track width. The connecting portion has a width greater than that of the tip portion.

When the track width defining layer 12a is formed, the coupling portion layer 12b made of a magnetic material is formed in the contact hole 9a, and a connecting layer 13 made of a magnetic material is formed on the connecting portion 10a at the same time. The coupling portion layer 12b makes up a portion of the top pole layer 12 that is magnetically coupled to the bottom pole layer 19.

Next, pole trimming is performed. That is, in a region around the track width defining layer 12a, the write gap layer 9 and at least a portion of the pole portion of the bottom pole layer 19 close to the write gap layer 9 are etched, using the track width defining layer 12a as a mask. As a result, as shown in FIG. 4, a trim structure is formed, wherein the pole portion of the top pole layer 12, the write gap layer 9 and at least a portion of the pole portion of the bottom pole layer 19 have equal widths. The trim structure has an effect of preventing an increase in effective track width resulting from an expansion of magnetic flux near the write gap layer 9.

Next, an insulating layer 14 made of an inorganic insulating material such as alumina and having a thickness of 3 to 4 μm, for example, is formed over the entire surface. The insulating layer 14 is then polished by CMP, for example, to reach the surfaces of the track width defining layer 12a, the coupling portion layer 12b and the connecting layer 13, and flattened.

Next, the second layer portion 15 of the thin-film coil made of copper (Cu), for example, and having a thickness of 2 to 3 μm, for example, is formed on the flattened insulating layer 14. In FIG. 3 numeral 15a indicates a connecting portion of the second layer portion 15 connected to the connecting portion 10a of the first layer portion 10 of the thin-film coil through the connecting layer 13. The second layer portion 15 is wound around the coupling portion layer 12b.

Next, an insulating layer 16 having a specific pattern is formed to cover the second layer portion 15 of the thin-film coil and the insulating layer 14 disposed around the second layer portion 15. The insulating layer 16 is made of an organic insulating material that exhibits fluidity when heated, such as photoresist. Next, heat treatment is performed at a specific temperature to flatten the surface of the insulating layer 16. Through this heat treatment, each of the outer and inner edge portions of the insulating layer 16 is made to have a shape of rounded sloped surface.

Next, the yoke portion layer 12c made of a magnetic material for the write head such as Permalloy is formed on the track width defining layer 12a, the insulating layers 14 and 16, and the coupling portion layer 12b. The yoke portion layer 12c makes up the yoke portion of the top pole layer 12. An end of the yoke portion layer 12c closer to the medium facing surface 20 is located apart from the medium facing surface 20. The yoke portion layer 12c is connected to the bottom pole layer 19 through the coupling portion layer 12b.

Next, an overcoat layer 17 made of alumina, for example, is formed to cover the entire surface. Finally, machining of the slider including the foregoing layers is performed to form the medium facing surface 20 of the thin-film magnetic head including the write head and the read head. The thin-film magnetic head is thus completed.

The thin-film magnetic head thus manufactured incorporates the medium facing surface 20 that faces toward a recording medium, the read head and the write head. The configuration of the read head will be described in detail later.

The write head incorporates the bottom pole layer 19 and the top pole layer 12 that are magnetically coupled to each other and include the pole portions that are opposed to each other and placed in regions on a side of the medium facing surface 20. The write head further incorporates: the write gap layer 9 provided between the pole portion of the bottom pole layer 19 and the pole portion of the top pole layer 12; and the thin-film coil including the portions 10 and 15 at least part of which is placed between the bottom pole layer 19 and the top pole layer 12 and insulated from the bottom pole layer 19 and the top pole layer 12. In this thin-film magnetic head, as shown in FIG. 3, the length from the medium facing surface 20 to the end of the insulating layer 11 closer to the medium facing surface 20 corresponds to throat height TH. The throat height is the length (height) from the medium facing surface 20 to the point at which the distance between the two pole layers starts to increase.

Figure 1:
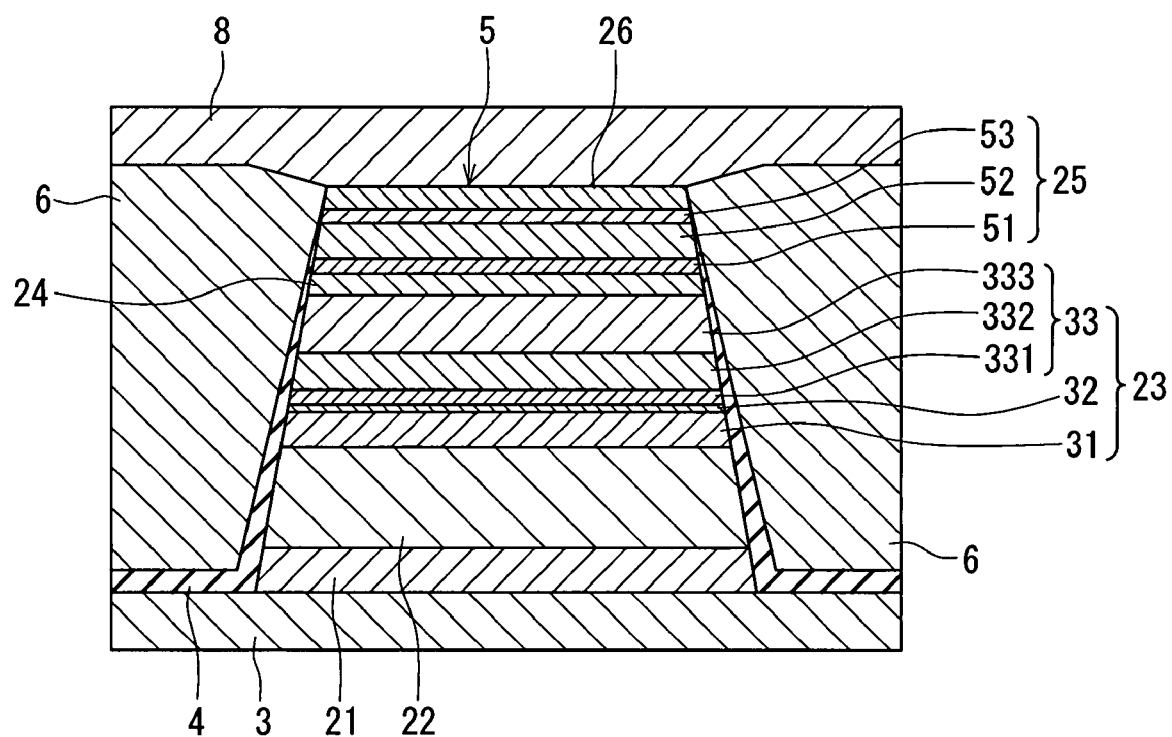
FIG. 1 is a cross-sectional view of a read head of a first embodiment of the invention, wherein the cross section is parallel to the medium facing surface.
Figure 2:
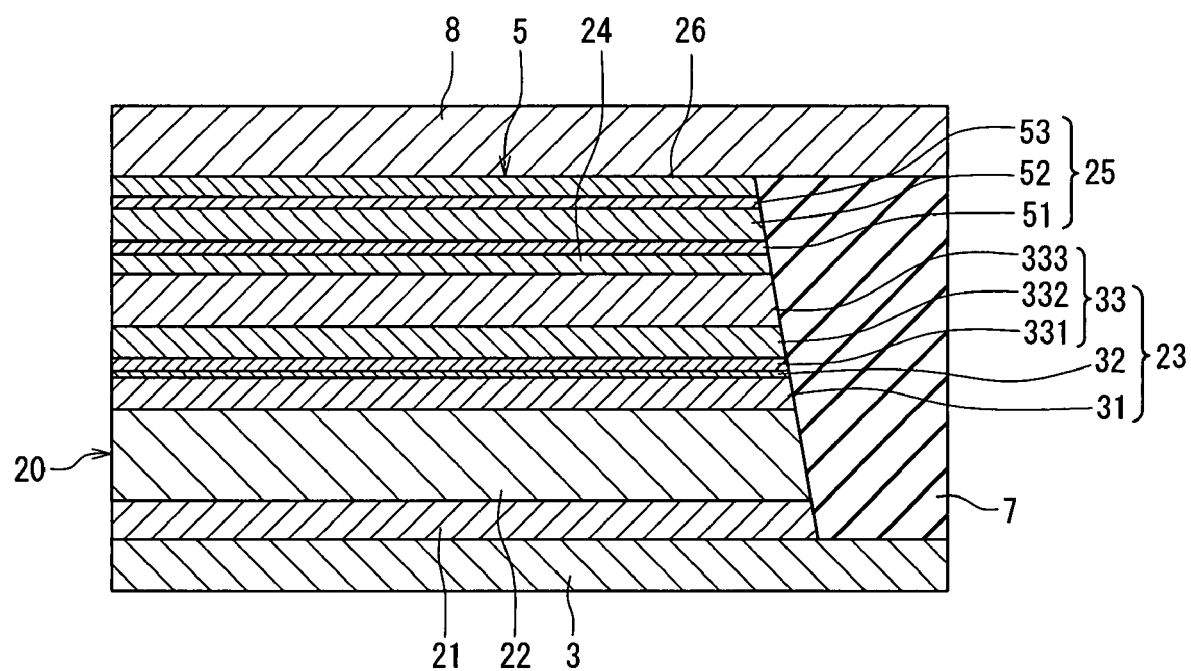
FIG. 2 is a cross-sectional view of the read head of the first embodiment of the invention, wherein the cross section is orthogonal to the medium facing surface and the top surface of the substrate.

Reference is now made to FIG. 1 and FIG. 2 to describe the details of the configuration of the read head. FIG. 1 is a cross-sectional view of the read head parallel to the medium facing surface. FIG. 2 is a cross-sectional view of the read head orthogonal to the medium facing surface and the top surface of the substrate.

The read head of the embodiment incorporates the first shield layer 3 and the second shield layer 8 disposed with a specific space from each other, and the MR element 5 disposed between the first shield layer 3 and the second shield layer 8. The MR element 5 has: a bottom surface; a top surface; two side surfaces disposed on both sides opposed to each other in the direction of track width; a first end face located in the medium facing surface 20; and a second end face located farther from the medium facing surface 20 (this end face will be hereinafter called a rear end face). Each of the bottom and top surfaces of the MR element 5 has a shape of a quadrilateral, especially a rectangle.

The read head further incorporates: the insulating film 4 that covers the two sides of the MR element 5 and part of the top surface of the first shield layer 3; and the two bias field applying layers 6 disposed adjacent to the two sides of the MR element 5 with the insulating film 4 disposed in between. The insulating film 4 is made of alumina, for example. The bias field applying layers 6 are each made of a hard magnetic layer (hard magnet) or a layered structure made up of ferromagnetic layers and antiferromagnetic layers, for example. To be specific, the bias field applying layers 6 are made of CoPt or CoCrPt, for example. The read head further incorporates the insulating layer 7 disposed around the MR element 5 and the bias field applying layers 6 in the region between the first shield layer 3 and the second shield layer 8.

The read head of the embodiment has the CPP structure. The first shield layer 3 and the second shield layer 8 also function as a pair of electrodes for feeding a sense current to the MR element 5 in a direction intersecting the plane of each layer making up the MR element 5, such as the direction perpendicular to the plane of each layer making up the MR element 5. Besides the first and second shield layers 3 and 8, a pair of electrodes may also be provided on the top and bottom of the MR element 5, respectively. The MR element 5 is a CPP-GMR element. The resistance of the MR element 5 changes in response to an external magnetic field, that is, a signal magnetic field from the recording medium. The sense current is fed in a direction intersecting the plane of each layer making up the MR element 5, such as the direction perpendicular to the plane of each layer making up the MR element 5. It is possible to determine the resistance of the MR element 5 from the sense current. It is thereby possible to read data stored on the recording medium through the use of the read head.

The MR element 5 incorporates an underlying layer 21, an antiferromagnetic layer 22, a pinned layer 23, a nonmagnetic conductive layer 24, a free layer 25 and a protection layer 26 that are stacked in this order on the first shield layer 3. The pinned layer 23 is a layer in which the direction of magnetization is fixed. The antiferromagnetic layer 22 is a layer that fixes the direction of magnetization in the pinned layer 23 by exchange coupling with the pinned layer 23. The underlying layer 21 is provided for improving the crystallinity and orientability of each layer formed thereon and particularly for enhancing the exchange coupling between the antiferromagnetic layer 22 and the pinned layer 23. The free layer 25 is a layer in which the direction of magnetization changes in response to an external magnetic field, that is, a signal magnetic field sent from the recording medium. The protection layer 26 is a layer for protecting the layers therebelow.

The underlying layer 21 has a thickness of 2 to 6 nm, for example. The underlying layer 21 may be made of a layered structure made up of a Ta layer and an Ru layer, for example.

The antiferromagnetic layer 22 has a thickness of 3 to 10 nm, for example, and may be made of an antiferromagnetic material including Mn and at least one element $M_{II}$ among the group consisting of Pt, Ru, Rh, Pd, Ni, Cu, Ir, Cr and Fe. The Mn content of the material preferably falls within a range of 35 to 95 atomic % inclusive. The content of the other element $M_{II}$ of the material preferably falls within a range of 5 to 65 atomic % inclusive. One type of antiferromagnetic material is a non-heat-induced antiferromagnetic material that exhibits antiferromagnetism without any heat treatment and induces an exchange coupling magnetic field between a ferromagnetic material and itself. Another type of antiferromagnetic material is a heat-induced antiferromagnetic material that exhibits antiferromagnetism by undergoing heat treatment. The antiferromagnetic layer 22 may be made of either of these types.

The non-heat-induced antiferromagnetic materials include an Mn alloy that has a γ phase, such as RuRhMn, FeMn, and IrMn. The heat-induced antiferromagnetic materials include an Mn alloy that has a regular crystal structure, such as PtMn, NiMn, and PtRhMn.

The direction of magnetization is fixed in the pinned layer 23 by means of the exchange coupling with the antiferromagnetic layer 22 at the interface between the antiferromagnetic layer 22 and the pinned layer 23. The pinned layer 23 of the embodiment is a so-called synthetic pinned layer that incorporates an outer layer 31, a nonmagnetic middle layer 32 and an inner layer 33 that are stacked in this order on the antiferromagnetic layer 22. The outer layer 31 is made of a ferromagnetic material such as FeCo. The inner layer 33 and the outer layer 31 are antiferromagnetic-coupled to each other and the directions of magnetization thereof are fixed to opposite directions. The outer layer 31 has a thickness of 3 to 7 nm, for example. The inner layer 33 has a thickness of 3 to 10 nm, for example.

The nonmagnetic middle layer 32 has a thickness of 0.35 to 1.0 nm, for example, and may be made of a nonmagnetic material including at least one element among the group consisting of Ru, Rh, Ir, Re, Cr, Zr and Cu. The nonmagnetic middle layer 32 is provided for creating antiferromagnetic exchange coupling between the inner layer 33 and the outer layer 31, and for fixing the magnetizations of these layers to opposite directions. The magnetizations of the inner layer 33 and the outer layer 31 in opposite directions include not only the case in which there is a difference of 180 degrees between these directions of magnetizations, but also the case in which there is a difference of 180±20 degrees between them.

The inner layer 33 includes an underlying magnetic layer 331, a Heusler alloy layer 332 and a middle magnetic layer 333 that are stacked in this order on the nonmagnetic middle layer 32. The directions of magnetization in the underlying magnetic layer 331, the Heusler alloy layer 332 and the middle magnetic layer 333 are fixed to the direction opposite to the direction of magnetization in the outer layer 31. The underlying magnetic layer 331 and the middle magnetic layer 333 are made of a ferromagnetic material such as FeCo. The Heusler alloy layer 332 is made of a Heusler alloy and has two surfaces that are quadrilateral in shape and face toward opposite directions. The shape of each of the two surfaces of the Heusler alloy layer 332 is rectangular, for example.

The nonmagnetic conductive layer 24 has a thickness of 1.0 to 4.0 nm, for example, and may be made of a nonmagnetic conductive material that includes 80 weight percent or greater of at least one element among the group consisting of Cu, Au and Ag. The nonmagnetic conductive layer 24 corresponds to the nonmagnetic layer of the invention.

The free layer 25 has a thickness of 2 to 8 nm, for example. The free layer 25 incorporates an underlying magnetic layer 51, a Heusler alloy layer 52 and a top magnetic layer 53 that are stacked in this order on the nonmagnetic conductive layer 24. The underlying magnetic layer 51 is made of a ferromagnetic material such as FeCo. The Heusler alloy layer 52 is made of a Heusler alloy and has two surfaces that are quadrilateral in shape and face toward opposite directions. The shape of each of the two surfaces of the Heusler alloy layer 52 is rectangular, for example. The top magnetic layer 53 is made of a ferromagnetic material such as NiFe.

The protection layer 26 has a thickness of 0.5 to 10 nm, for example. The protection layer 26 may be made of an Ru layer having a thickness of 2 nm, for example.

The operation of the thin-film magnetic head of the embodiment will now be described. The thin-film magnetic head writes data on a recording medium by using the write head and reads data written on the recording medium by using the read head.

In the read head, the direction of the bias magnetic field created by the bias field applying layers 6 intersects the direction orthogonal to the medium facing surface 20 at a right angle. In the MR element 5 the direction of magnetization in the free layer 25 is aligned with the direction of the bias magnetic field when no signal magnetic field exists. The direction of magnetization in the pinned layer 23 is fixed to the direction orthogonal to the medium facing surface 20.

In the MR element 5, the direction of magnetization of the free layer 25 changes in response to the signal magnetic field sent from the recording medium. The relative angle between the direction of magnetization of the free layer 25 and the direction of magnetization of the pinned layer 23 is thereby changed. As a result, the resistance of the MR element 5 changes. The resistance of the MR element 5 is obtained from the potential difference between the first and second shield layers 3 and 8 when a sense current is fed to the MR element 5 from the shield layers 3 and 8. In such a manner, the data stored on the recording medium is read by the read head.

Features of the MR element 5 of the embodiment will now be described. The MR element 5 of the embodiment incorporates: the nonmagnetic conductive layer 24 having a first surface (bottom surface) and a second surface (top surface) facing toward opposite directions; the pinned layer 23 disposed adjacent to the first surface (the bottom surface) of the nonmagnetic conductive layer 24, the direction of magnetization in the pinned layer 23 being fixed; and the free layer 25 disposed adjacent to the second surface (the top surface) of the nonmagnetic conductive layer 24, the direction of magnetization in the free layer 25 changing in response to an external magnetic field. A sense current is fed to the MR element 5 in a direction intersecting the plane of each layer making up the MR element 5, such as the direction perpendicular to the plane of each layer making up the MR element 5.

The pinned layer 23 of the embodiment incorporates the outer layer 31, the nonmagnetic middle layer 32 and the inner layer 33 that are stacked in this order on the antiferromagnetic layer 22. The inner layer 33 includes the underlying magnetic layer 331, the Heusler alloy layer 332 and the middle magnetic layer 333 that are stacked in this order on the nonmagnetic middle layer 32. The free layer 25 includes the underlying magnetic layer 51, the Heusler alloy layer 52 and the top magnetic layer 53 that are stacked in this order on the nonmagnetic conductive layer 24.

Each of the Heusler alloy layers 332 and 52 has two surfaces that are quadrilateral in shape and face toward opposite directions. Each of the Heusler alloy layers 332 and 52 includes one crystal grain that touches the four sides of one of the two surfaces.

Each of the two surfaces of each of the Heusler alloy layers 332 and 52 is rectangle-shaped, for example. In this case, it is preferred that the length of the longer side of one of the two surfaces of each of the Heusler alloy layers 332 and 52 be equal to or smaller than 200 nm. It is preferred that the area of the one of the two surfaces of each of the Heusler alloy layers 332 and 52 be equal to or smaller than 10000 nm$^2$.

Figure 9:
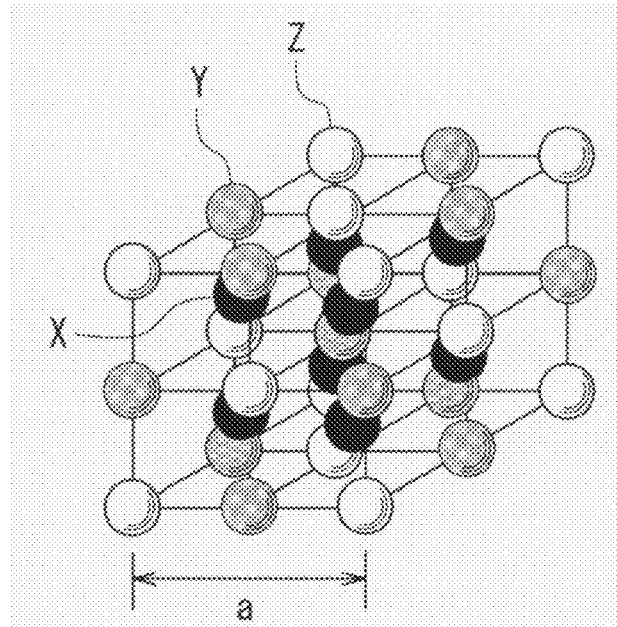
FIG. 9 is a view for illustrating an $L2_1$ structure.
Figure 10:
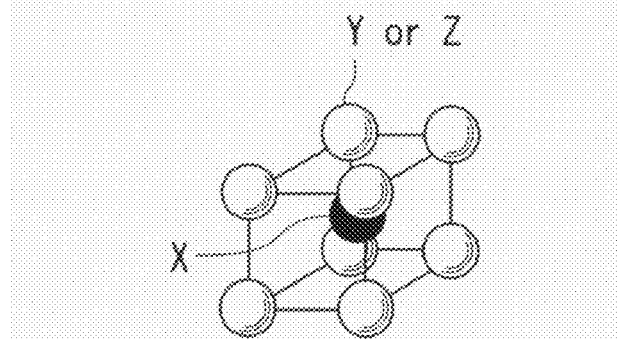
FIG. 10 is a view for illustrating a B2 structure.
Figure 11:
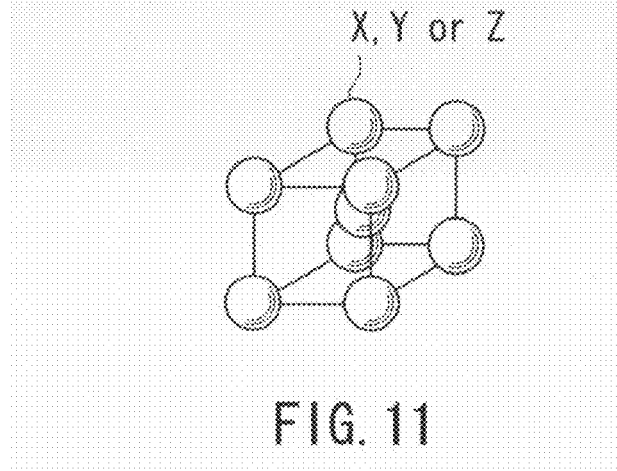
FIG. 11 is a view for illustrating an A2 structure.

Reference is now made to FIG. 9 to FIG. 11 to describe types of the crystal structure that a typical full Heusler alloy can have. Here, the chemical composition of a typical full Heusler alloy is indicated as $X_2YZ$, as in the description of the section "Description of the Related Art". A typical full Heusler alloy can have three types of crystal structure, that is, the $L2_1$ structure, the B2 structure and the A2 structure. FIG. 9 illustrates the $L2_1$ structure. FIG. 10 illustrates the B2 structure. FIG. 11 illustrates the A2 structure. Each of the $L2_1$ structure, the B2 structure and the A2 structure is similar to the body-centered cubic structure.

In the $L2_1$ structure shown in FIG. 9, atoms of an element X are respectively placed at body-centered positions of unit cells, and atoms of an element Y and atoms of an element Z are alternately placed at vertexes of the unit cells regularly.

In the B2 structure shown in FIG. 10, atoms of the element X are respectively placed at body-centered positions of unit cells, and atoms of the element Y or atoms of the element Z are randomly placed at vertexes of the unit cells.

In the A2 structure shown in FIG. 11, atoms of the element X, atoms of the element Y, or atoms of the element Z are randomly placed at each of body-centered positions and vertexes of unit cells.

Among the $L2_1$ structure, the B2 structure and the A2 structure, a high spin polarization occurs in the $L2_1$ structure and the B2 structure.

In the $L2_1$ structure of FIG. 9, the space between adjacent ones of the atoms of the element Y or the atoms of the element Z taken in the direction in which the atoms of the element Y and the atoms of the element Z are alternately arranged in a row is called an interlattice spacing of the Heusler alloy and indicated with "a". The size of the interlattice spacing "a" of the Heusler alloy is about 0.5 nm.

Each of the Heusler alloy layers 332 and 52 includes a principal component having the $L2_1$ structure or the B2 structure. Here, the "principal component" of the Heusler alloy layers 332 and 52 is a component of the crystal structure that is greatest in number when the crystal structure of the Heusler alloy layers 332 and 52 is determined by X-ray diffraction. In order for the Heusler alloy layers 332 and 52 to have the function as the Heusler alloy, it is required that the thickness of the Heusler alloy layers 332 and 52 and the length of each side of each surface be equal to or greater than the interlattice spacing "a" of the Heusler alloy, that is, 0.5 nm or greater, for example.

Reference is now made to FIG. 12A to FIG. 21 to describe a method of manufacturing the MR element 5 of the embodiment. FIG. 12A to FIG. 16A and FIG. 20A each show a cross section of a layered structure obtained in the manufacturing process of the MR element 5. FIG. 12B to FIG. 16B and FIG. 20B each show a top surface of the layered structure obtained in the manufacturing process of the MR element 5.

Figure 12A:
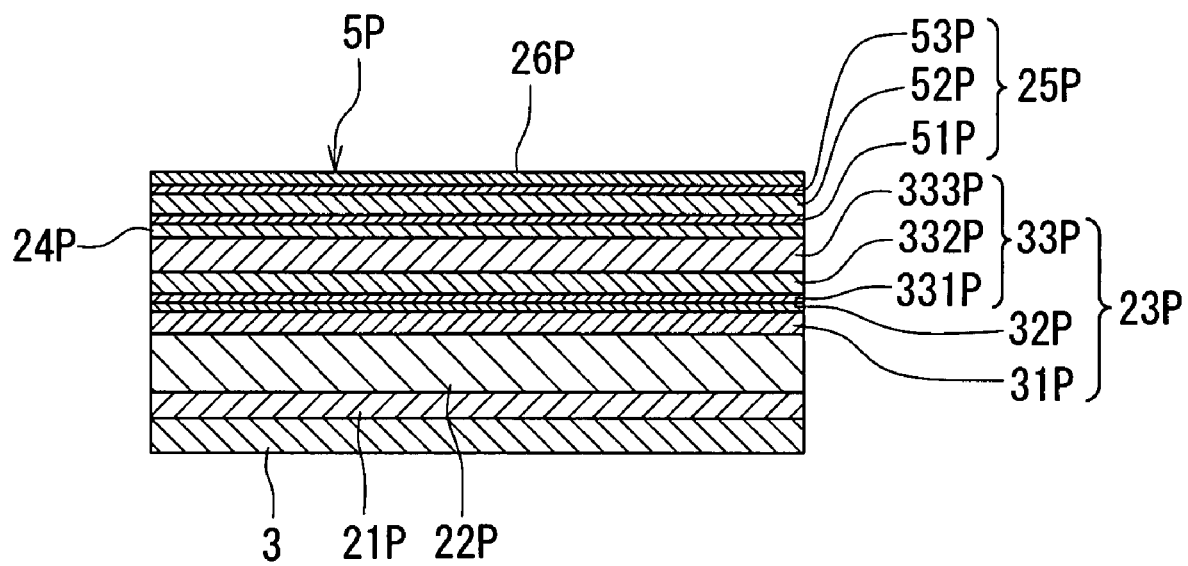
FIG. 12A and FIG. 12B are views for illustrating a step of a method of manufacturing an MR element of the first embodiment of the invention.
Figure 12B:
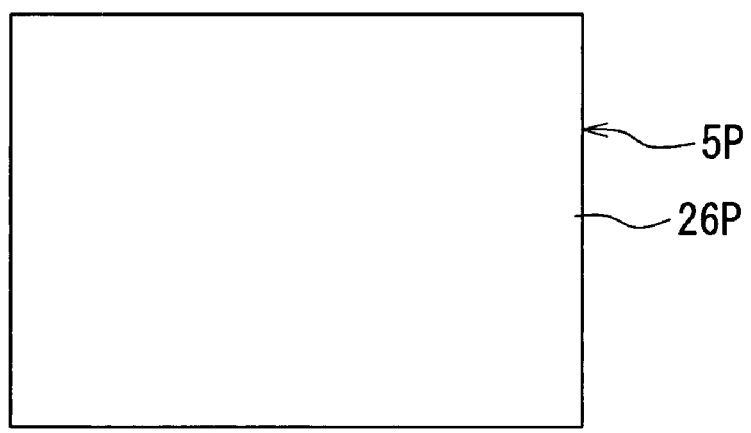

FIG. 12A and FIG. 12B illustrate a step of the method of manufacturing the MR element 5 of the embodiment. In the step, a method such as sputtering is employed to form a film 21P to be the underlying layer 21, a film 22P to be the antiferromagnetic layer 22, a film 23P to be the pinned layer 23, a film 24P to be the nonmagnetic conductive layer 24, a film 25P to be the free layer 25, and a film 26P to be the protection layer 26 in this order on the first shield layer 3. A layered film 5P including these films is thereby formed. This step corresponds to the "step of forming the layered film" of the invention.

The film 23P includes a film 31P to be the outer layer 31, a film 32P to be the nonmagnetic middle layer 32, and a film 33P to be the inner layer 33 that are stacked in this order on the film 22P. The film 33P includes a film 331P to be the underlying magnetic layer 331, a film 332P to be the Heusler alloy layer 332, and a film 333P to be the middle magnetic layer 333 that are stacked in this order on the film 32P. The film 25P includes a film 51P to be the underlying magnetic layer 51, a film 52P to be the Heusler alloy layer 52, and a film 53P to be the top magnetic layer 53 that are stacked in this order on the film 24P.

Figure 13A:
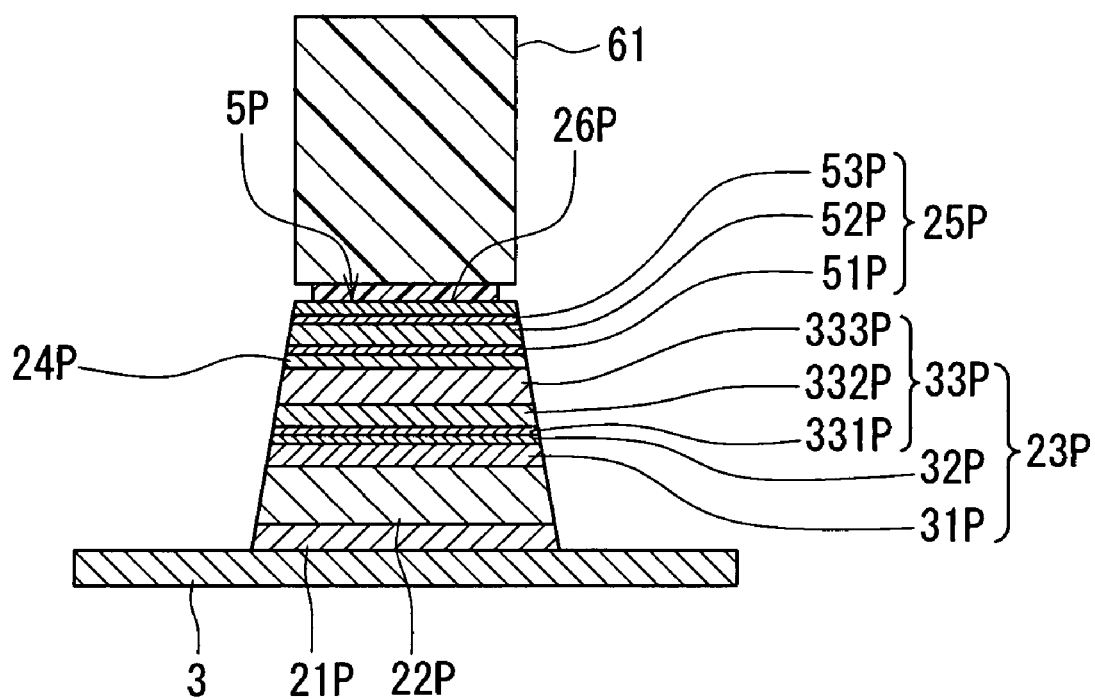
FIG. 13A and FIG. 13B are views for illustrating a step that follows the step of FIG. 12A and FIG. 12B.
Figure 13B:
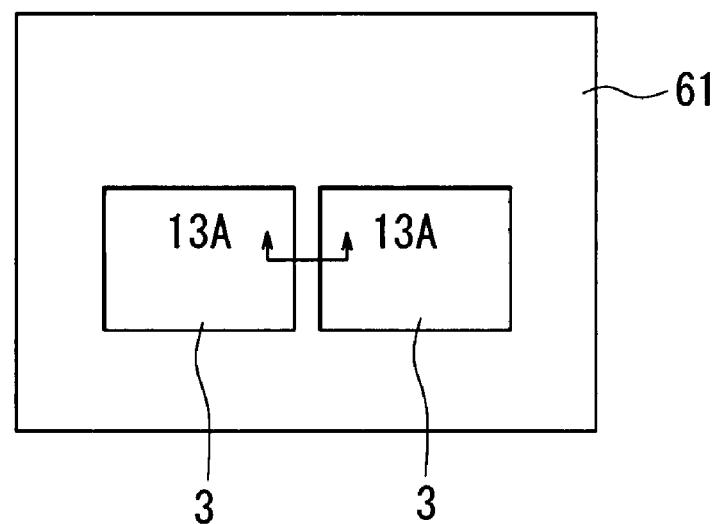

FIG. 13A and FIG. 13B illustrate the following step. FIG. 13A shows a cross section taken along line 13A-13A of FIG. 13B. In the step, first, a mask 61 is formed on the layered film 5P. The mask 61 has two openings formed in regions in which the two bias field applying layers 6 are to be located. The mask 61 has a shape with an undercut, for example. The mask 61 may be formed by forming a first layer made of a material capable of being dissolved in a developer and then forming a second layer made of photoresist on the first layer, patterning the second layer by photolithography, and dissolving part of the first layer in the developer. Next, part of the layered film 5P is etched by ion milling, for example, using the mask 61 as an etching mask.

Figure 14A:
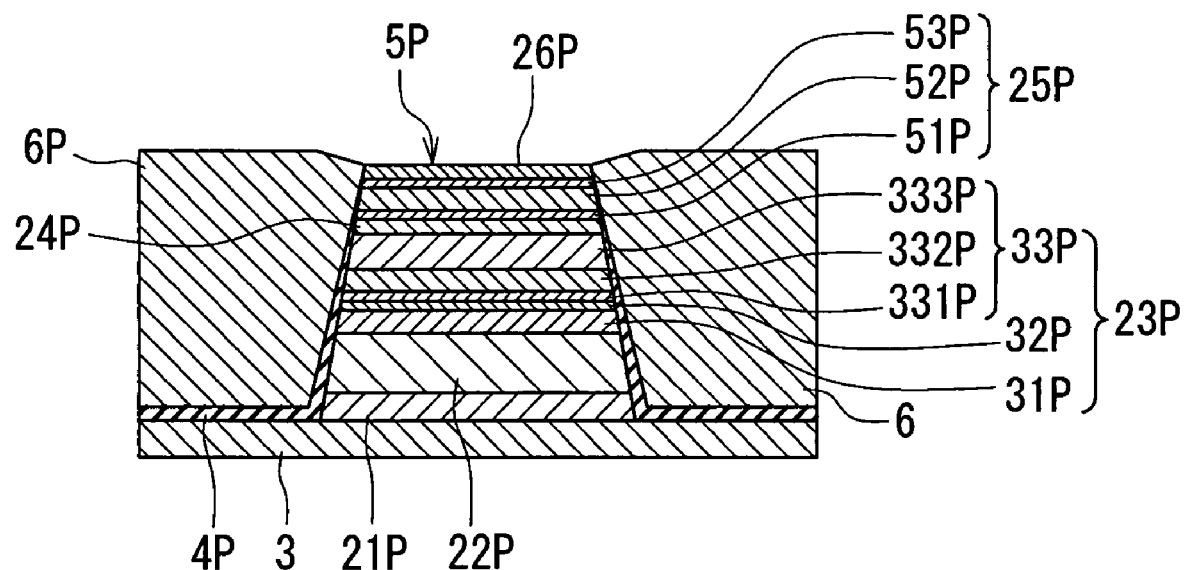
FIG. 14A and FIG. 14B are views for illustrating a step that follows the step of FIG. 13A and FIG. 13B.
Figure 14B:
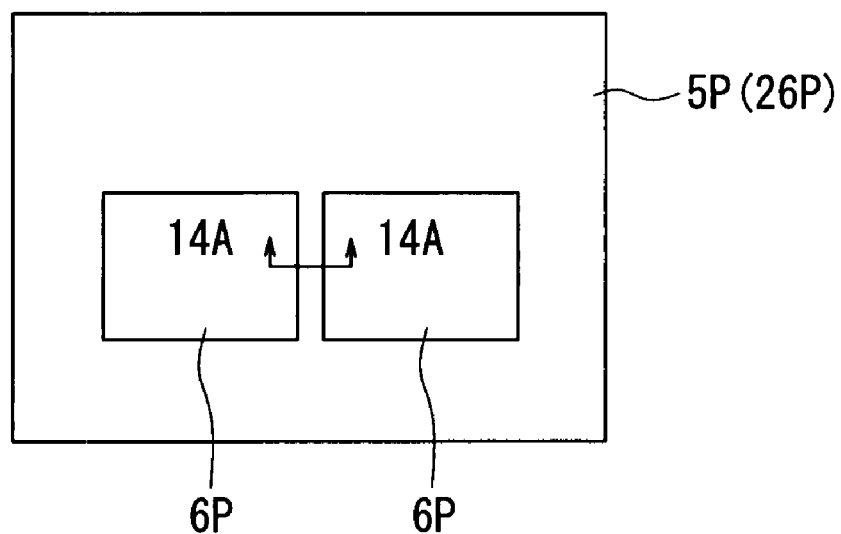

FIG. 14A and FIG. 14B illustrate the following step. FIG. 14A shows a cross section taken along line 14A-14A of FIG. 14B. In the step, first, a film 4P to be the insulating film 4 and a film 6P to be the bias field applying layers 6 are stacked in this order by sputtering, for example, on the layered structure of FIG. 13A and FIG. 13B. The mask 61 is then lifted off.

Figure 15A:
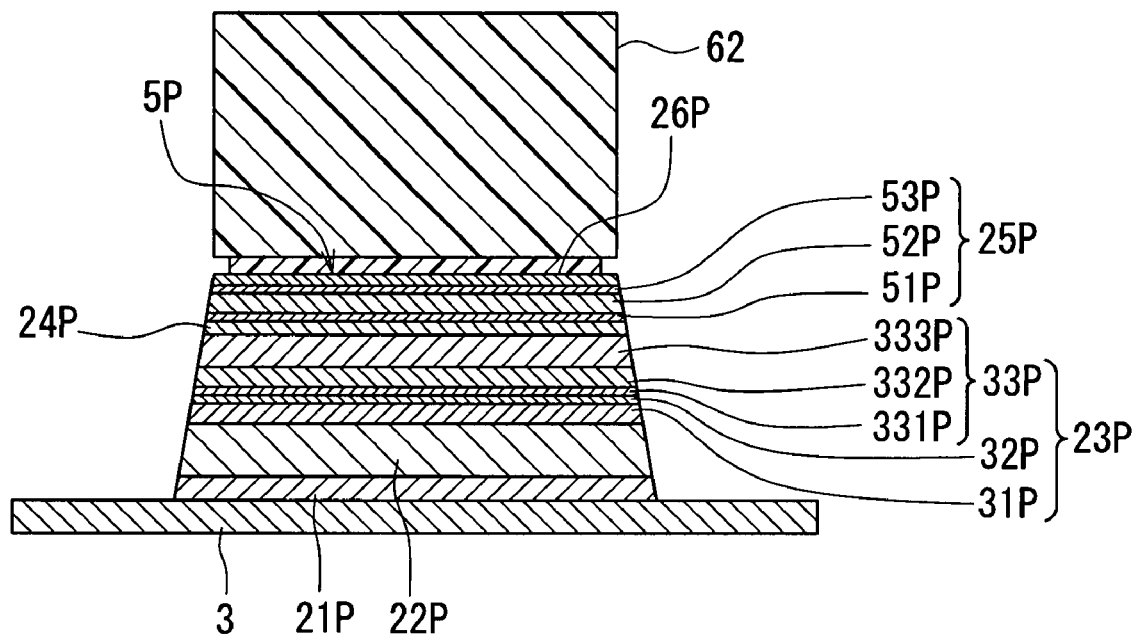
FIG. 15A and FIG. 15B are views for illustrating a step that follows the step of FIG. 14A and FIG. 14B.
Figure 15B:
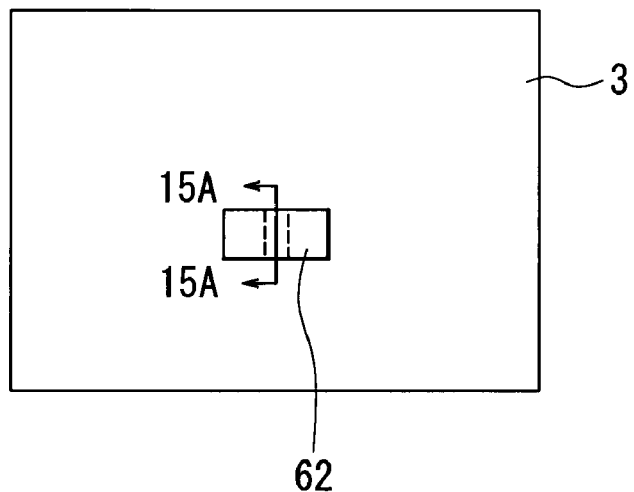

FIG. 15A and FIG. 15B illustrate the following step. FIG. 15A shows a cross section taken along line 15A-15A of FIG. 15B. In the step, first, a mask 62 is formed on the layered structure of FIG. 14A and FIG. 14B. The mask 62 defines the shapes of the MR element 5, the insulating film 4 and the bias field applying layers 6. The mask 62 has a shape with an undercut, for example. The mask 62 may be formed by a method the same as the method of forming the mask 61. Next, portions of the layered film 5P and the films 4P and 6P are etched by ion milling, for example, using the mask 62 as an etching mask. The remaining portions of the films 4P and 6P after this etching become the insulating film 4 and the bias field applying layers 6, respectively.

Figure 16A:
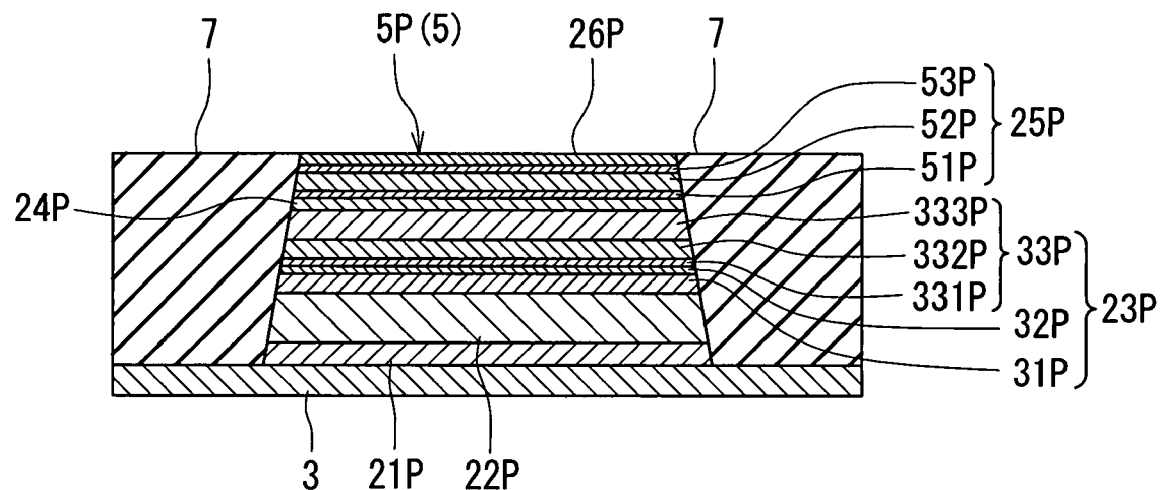
FIG. 16A and FIG. 16B are views for illustrating a step that follows the step of FIG. 15A and FIG. 15B.
Figure 16B:
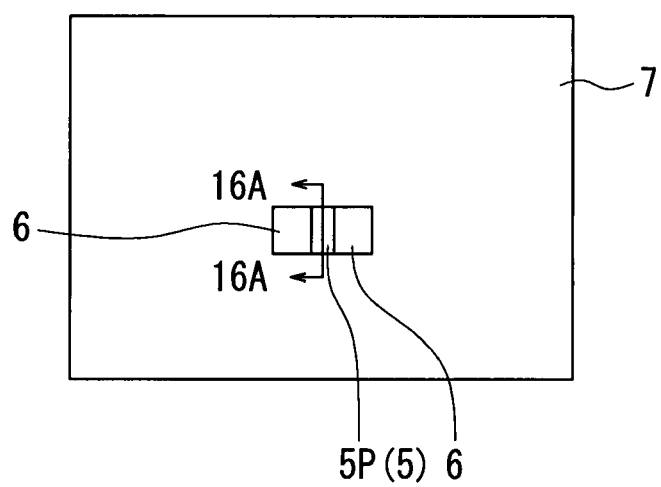

FIG. 16A and FIG. 16B illustrate the following step. FIG. 16A shows a cross section taken along line 16A-16A of FIG. 16B. In the step, first, the insulating layer 7 is formed by sputtering, for example, on the layered structure of FIG. 15A and FIG. 15B. The mask 62 is then lifted off.

The series of steps illustrated in FIG. 13A to FIG. 16A and FIG. 13B to FIG. 16B corresponds to the "step of patterning the layered film" of the invention. Through this series of steps, each of the films 332P and 52P to be the Heusler alloy layers are made to have a shape having two surfaces that are quadrilateral in shape and that face toward opposite directions.

Next, heat treatment is performed on the layered film 5P so that the crystal grains contained in the films 332P and 52P to be the Heusler alloy layers grow and that, in each of the films 332P and 52P, one crystal grain that touches the four sides of one of the two surfaces, such as the top surface, is formed. This step corresponds to the "step of performing heat treatment on the layered film" of the invention. The principal crystal structure of each of the films 332P and 52P immediately after they are formed is the A2 structure. By performing heat treatment on the layered film 5P, the crystal structure of the principal component of each of the films 332P and 52P is changed into the $L2_1$ or B2 structure. This heat treatment is performed by heating the layered film 5P at a specific temperature. The specific temperature is preferably 250° C. or higher. The temperature of 250° C. or higher is such a temperature that, in each of the films 332P and 52P, the growth of crystal grains and a change of the crystal structure of the principal component into the $L2_1$ or B2 structure both occur. By way of example, the heat treatment is performed by heating the layered film 5P at 290° C. for three hours. Through the foregoing steps, the films 332P and 52P become the Heusler alloy layers 332 and 52, respectively, and the layered film 5P becomes the MR element 5.

Then, as shown in FIG. 1 and FIG. 2, the second shield layer 8 is formed on the MR element 5, the bias field applying layers 6 and the insulating layer 7.

Figure 17:
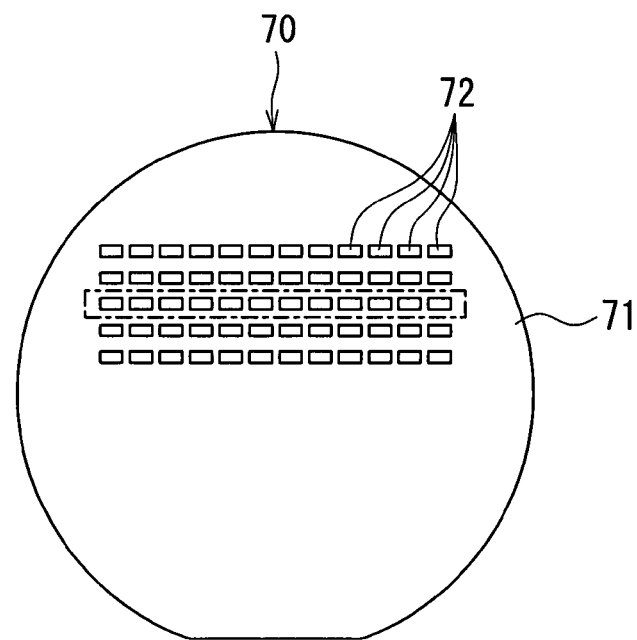
FIG. 17 is a view for illustrating a step of a method of manufacturing the thin-film magnetic head of the first embodiment of the invention.

Reference is now made to FIG. 17 to FIG. 19, FIG. 20A and FIG. 20B to describe a method of manufacturing a thin-film magnetic head of the embodiment and a magnetoresistive element aggregate of the embodiment. The method of manufacturing the thin-film magnetic head of the embodiment includes the step of fabricating a first magnetic head aggregate 70 in which pre-head portions 72 that will be respective thin-film magnetic heads later are aligned in a plurality of rows, as shown in FIG. 17. The first magnetic head aggregate 70 is fabricated by forming a plurality of components of the thin-film magnetic heads on a single wafer 71. Later, the wafer 71 will be the substrate 1 shown in FIG. 3 and FIG. 4. The pre-head portions 72 incorporates the components of the thin-film magnetic heads shown in FIG. 3 and FIG. 4 except the medium facing surface 20. Therefore, the pre-head portions 72 include portions to be the MR elements 5. The pre-head portions 72 thus correspond to the pre-element portions of the invention. Furthermore, the step of fabricating the magnetic head aggregate 70 includes the manufacturing process of the MR element 5 described with reference to FIG. 12A to FIG. 16A and FIG. 12B to FIG. 16B. Since the head aggregate 70 incorporates the plurality of pre-head portions 72 (the pre-element portions) that will be separated from one another later, the head aggregate 70 corresponds to the magnetoresistive element aggregate of the invention, and is one of magnetoresistive element aggregates of the embodiment.

In each of the pre-head portions 72 in the magnetic head aggregate 70, the pinned layer 23 includes the Heusler alloy layer 332, and the free layer 25 includes the Heusler alloy layer 52. In each of the pre-head portions 72, each of the Heusler alloy layers 332 and 52 includes one crystal grain that touches the four sides of one of the two surfaces of each of the Heusler alloy layers 332 and 52.

Figure 18:
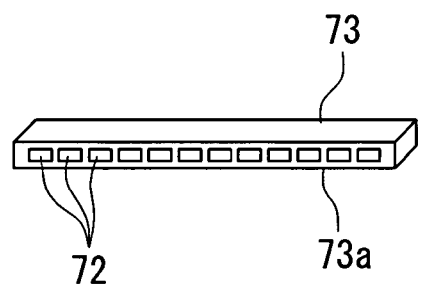
FIG. 18 is a view for illustrating a step that follows the step of FIG. 17.

The method of manufacturing the thin-film magnetic head of the embodiment further includes the step of fabricating a second magnetic head aggregate 73 by cutting the first magnetic head aggregate 70. As shown in FIG. 18, the second magnetic head aggregate 73 incorporates a row of the pre-head portions 72. The second magnetic head aggregate 73 may also be called a bar. In FIG. 17, the region surrounded by a broken line indicates a region corresponding to one of a plurality of magnetic head aggregates 73. The head aggregate 73 has two surfaces (the top and bottom surfaces of FIG. 18) formed by cutting the first magnetic head aggregate 70. One of the two surfaces (the bottom surface of FIG. 18) 73a is a surface that will be the medium facing surface 20 later by polishing. Since the second magnetic head aggregate 73 also incorporates the plurality of pre-head portions 72 (the pre-element portions) that will be separated from one another later, the head aggregate 73 corresponds to the magnetoresistive element aggregate of the invention, and is one of the magnetoresistive element aggregates of the embodiment.

Figure 19:
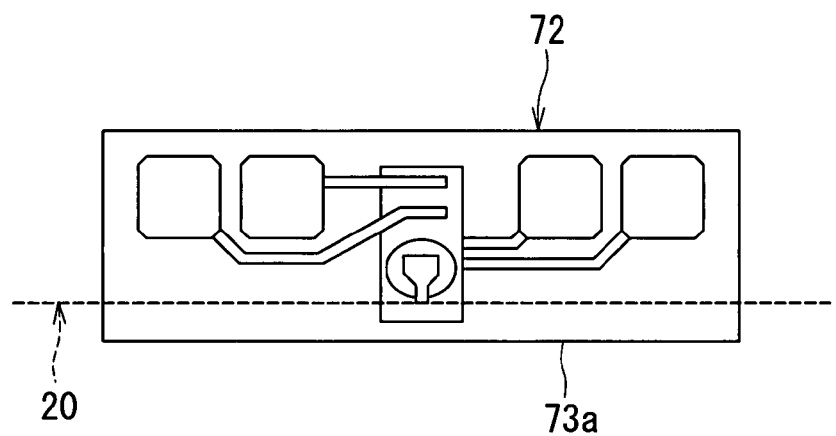
FIG. 19 is a view for illustrating a step that follows the step of FIG. 18.

In the following step of the method of manufacturing the thin-film magnetic head of the embodiment, the surface 73a of the head aggregate 73 is polished to form the medium facing surfaces 20 of all the pre-head portions 72 that the head aggregate 73 includes. FIG. 19 shows one of the pre-head portions 72 before undergoing the polishing. In FIG. 19 the broken line indicates the position of the medium facing surface 20 to be formed by polishing the surface 73a.

Figure 20A:
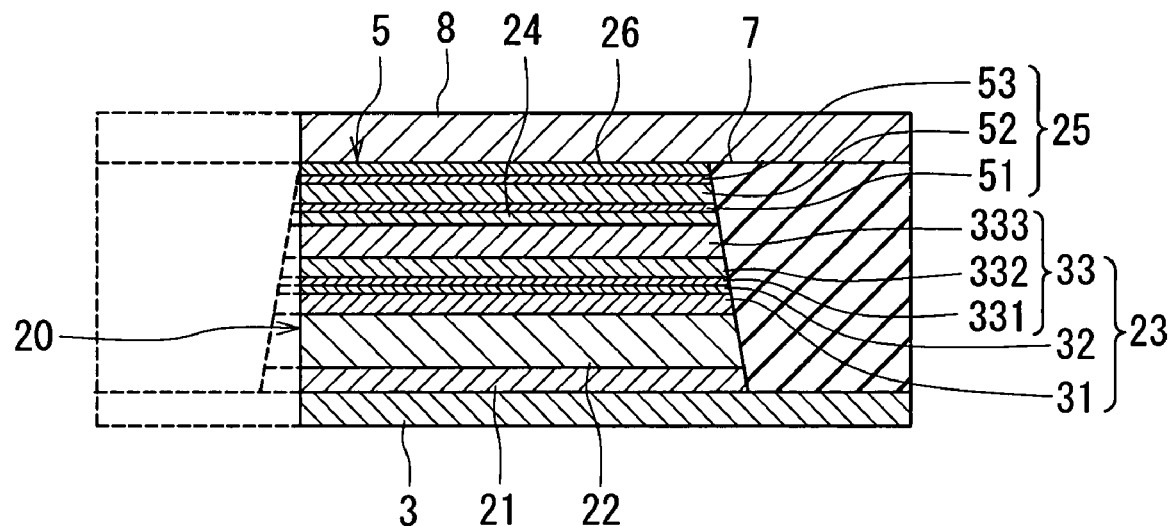
FIG. 20A and FIG. 20B are views for illustrating the read head in which the medium facing surface has been formed.
Figure 20B:
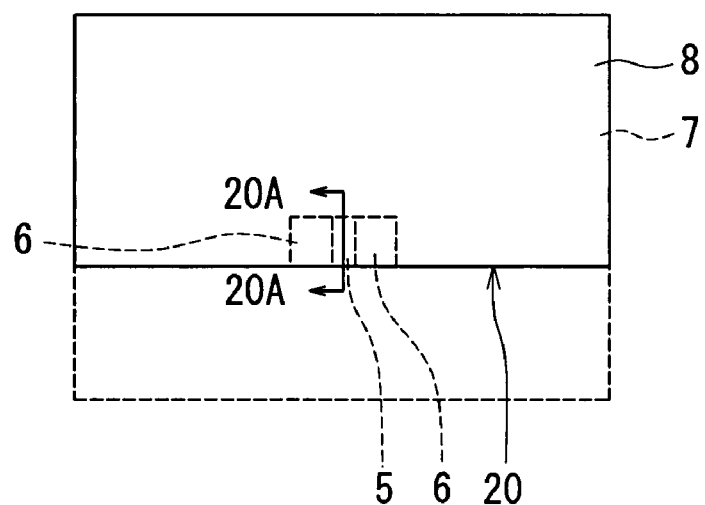

FIG. 20A and FIG. 20B illustrate the read head in which the medium facing surface 20 has been formed. FIG. 20A shows a cross section of the read head. FIG. 20B shows the top surface of the read head. The cross section of FIG. 20A is taken along line 20A-20A of FIG. 20B. In the embodiment, through the series of steps illustrated in FIG. 12A to FIG. 16A and FIG. 12B to FIG. 16B, the MR element 5 has a nearly final shape at the point before the polishing step for forming the medium facing surface 20. In the MR element 5 at the point before the polishing step, for example, the two side surfaces of the MR element 5 and the two end faces of the MR element 5, that is, the end face that will be the medium facing surface 20 after polishing (which will be hereinafter called a front end face) and the rear end face, are all tilted with respect to the direction orthogonal to the top surface of the substrate 1, so that the area of the top surface of the MR element 5 is smaller than the area of the bottom surface of the MR element 5. In the polishing step, the front end face of the MR element 5 is polished to such an extent that the front end face becomes orthogonal to the top surface of the substrate 1.

In following step of the method of manufacturing the thin-film magnetic head of the embodiment, rails for making the sliders fly above the recording medium are formed in the medium facing surfaces 20 of all the pre-head portions 72 that the head aggregate 73 includes. Next, the head aggregate 73 is cut to separate the pre-head portions 72 from one another. Each of the pre-head portions 72 becomes the thin-film magnetic head of the embodiment.

Reference is now made to FIG. 21 to describe changes in the films 332P and 52P to be the Heusler alloy layers and the Heusler alloy layers 332 and 52 in the method of manufacturing the thin-film magnetic head of the embodiment. FIG. 21(a) schematically illustrates the state of crystal grains in the top surface of the films 332P and 52P immediately after they are formed in the step illustrated in FIG. 12A and FIG. 12B. FIG. 21(b) schematically illustrates the state of crystal grains in the top surface of the films 332P and 52P after they are patterned through the series of steps illustrated in FIG. 13A to FIG. 16A and FIG. 13B to FIG. 16B. FIG. 21(c) schematically illustrates the state of crystal grains in the top surface of the Heusler alloy layers 332 and 52 after heat treatment is given to the layered film 5P. As shown in FIG. 21(b) and FIG. 21(c), by giving heat treatment to the layered film 5P, the crystal grains that the films 332P and 52P include are grown, and one crystal grain that touches the four sides of one of the two surfaces, such as the top surface, of each of the films 332P and 52P is formed. The films 332P and 52P thereby become the Heusler alloy layers 332 and 52, respectively. FIG. 21(d) schematically illustrates the state of crystal grains in the top surface of the Heusler alloy layers 332 and 52 after the polishing step illustrated in FIG. 20A and FIG. 20B. Compared with the state before the polishing step, the length of each of the Heusler alloy layers 332 and 52 taken in the direction orthogonal to the medium facing surface 20 is slightly smaller after the polishing step. In FIG. 21(d) the portion indicated with the broken line is the portion removed in the polishing step.

As shown in FIG. 21(b), the top surface of each of the films 332P and 52P patterned is rectangle-shaped. It is required that the length of a longer side of the top surface of each of the films 332P and 52P patterned be a length that allows one of the crystal grains that the films 332P and 52P include to grow and to touch the four sides of the top surface of each of the films 332P and 52P in the step of performing heat treatment on the layered film 5P. Therefore, it is preferred that the length of the longer side of the top surface of each of the films 332P and 52P patterned be equal to or smaller than the maximum diameter that the crystal grains included in the films 332P and 52P unpatterned would reach by growing through heat treatment to the films 332P and 52P unpatterned. To be specific, it is preferred that the length of the longer side of the top surface of each of the films 332P and 52P patterned be equal to or smaller than 200 nm.

As shown in FIG. 21(d), the top surface of each of the Heusler alloy layers 332 and 52 is rectangular in shape. The bottom surface of each of the Heusler alloy layers 332 and 52 is also rectangular in shape. In the top surface of each of the Heusler alloy layers 332 and 52, two sides parallel to each other extend in the direction orthogonal to the medium facing surface 20. The length of these two sides is indicated with H. In addition, in the top surface of each of the Heusler alloy layers 332 and 52, the remaining two sides extend in the direction parallel to the medium facing surface 20. The length of these two sides is indicated with W. In the embodiment, H is greater than W. Therefore, in the top surface of each of the Heusler alloy layers 332 and 52, the two sides extending in the direction orthogonal to the medium facing surface 20 are the longer sides, and the two sides extending in the direction parallel to the medium facing surface 20 are the shorter sides.

From the results of an experiment that will be shown later, it is preferred that the length H of the longer sides of the top surface of each of the Heusler alloy layers 332 and 52 be equal to or smaller than 200 nm. The area of the top surface of each of the Heusler alloy layers 332 and 52 is preferably equal to or smaller than 10000 nm$^2$.

In the embodiment, as shown in FIG. 20A, the geometry of the top surface of the Heusler alloy layer 52 is slightly smaller than that of the top surface of the Heusler alloy layer 332. Therefore, if the Heusler alloy layer 332 satisfies a condition that the length H of the longer sides is equal to or smaller than 200 nm or the area of the top surface is equal to or smaller than 10000 nm$^2$, then the Heusler alloy layer 52 necessarily satisfies the same condition.

In view of improving the recording density of the magnetic disk drive, it is preferred that the length of each side of the bottom and top surfaces of the MR element 5 be as small as possible. Therefore, it is also preferred that the length of each side of the top surface of each of the Heusler alloy layers 332 and 52 be as small as possible. However, as previously described, in order for each of the Heusler alloy layers 332 and 52 to have the function of the Heusler alloy, it is required that the thickness of each of the Heusler alloy layers 332 and 52 and the length of each side of each surface of each of the Heusler alloy layers 332 and 52 be each equal to or greater than the interlattice spacing "a" of the Heusler alloy, such as 0.5 nm or greater. It is therefore required that the area of the top surface of each of the Heusler alloy layers 332 and 52 be equal to or greater than the square of the interlattice spacing "a" of the Heusler alloy, such as 0.25 nm$^2$ or greater.

Reference is now made to the results of the experiment to describe effects of the MR element 5 and the method of manufacturing the same, the magnetoresistive element aggregate, and the thin-film magnetic head of the embodiment. In the experiment, fifty samples were fabricated for each of the MR elements 5 of first to sixth examples of the embodiment and a reference MR element. Table 1 below lists the film configuration of the MR elements 5 of the first to sixth examples of the embodiment and the reference MR element.

TABLE 1

| Layer | | Substance | Thickness (nm) |
|---|---|---|---|
| Protection layer | | Ru | 2 |
| Free layer | | NiFe | 1.5 |
| | | $Co_2MnGe$ | 3 |
| | | FeCo | 1 |
| Nonmagnetic conductive layer | | Cu | 2 |
| Pinned layer | Inner layer | FeCo | 5 |
| | | $Co_2MnGe$ | 3 |
| | | FeCo | 1 |
| | Nonmagnetic middle layer | Ru | 0.7 |
| | Outer layer | FeCo | 3 |
| Antiferromagnetic layer | | IrMn | 4.5 |
| Underlying layer | | Ru | 2 |
| | | Ta | 2 |

The MR elements 5 of the first to sixth examples of the embodiment were fabricated through the method of manufacturing the MR element 5 of the embodiment. Heat treatment to the layered film 5P for fabricating the MR elements 5 of the first to sixth examples was performed by heating the layered film 5P at a temperature of 290° C. for three hours.

The reference MR element was fabricated through a method different from the method of manufacturing the MR element 5 of the embodiment. That is, to fabricate the reference MR element, heat treatment to the layered film 5P was not performed after patterning the layered film 5P as in the embodiment. Instead, after forming the layered film 5P as shown in FIG. 12A and FIG. 12B, heat treatment was given to the layered film 5P before undergoing patterning through the series of steps shown in FIG. 13A to FIG. 16A and FIG. 13B to FIG. 16B. The heat treatment to fabricate the reference MR element was performed by heating the layered film 5P at a temperature of 290° C. for three hours.

Figure 27:
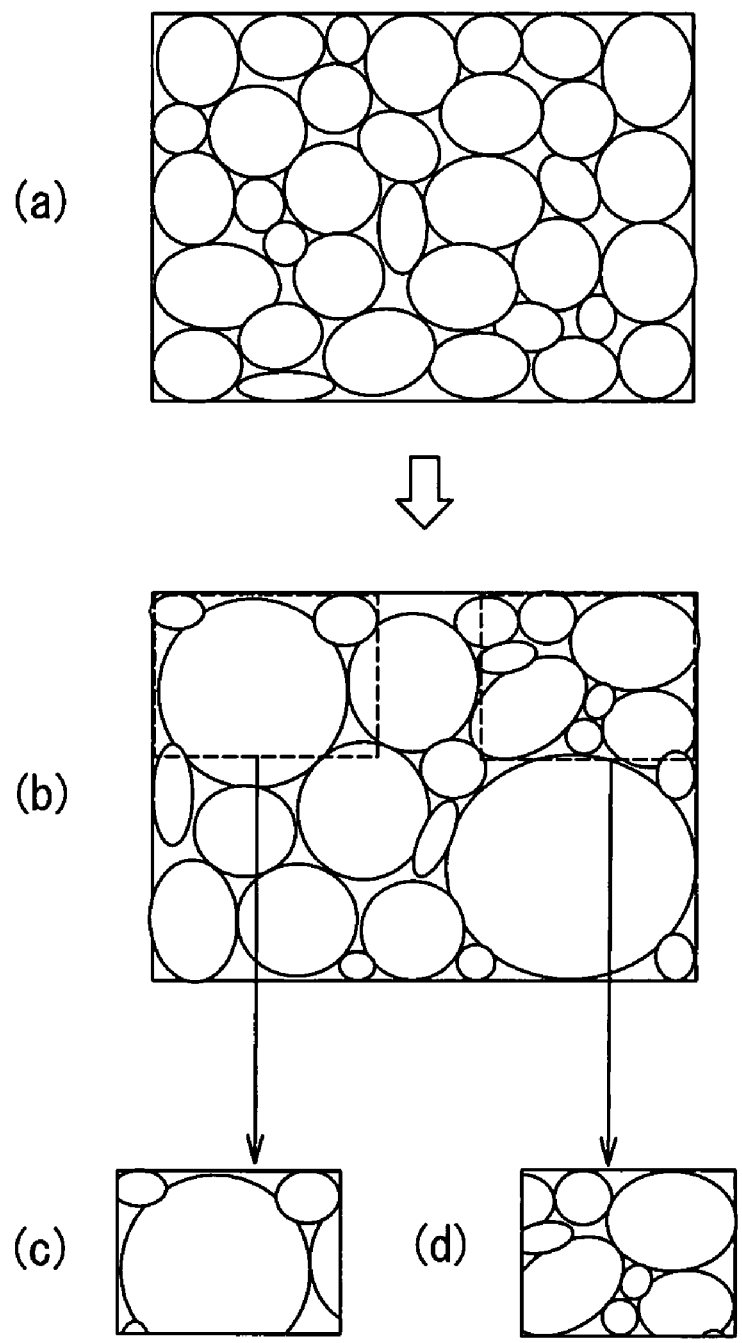
FIG. 27 is a view for illustrating problems of a method of manufacturing an MR element according to related art.

Each of the Heusler alloy layers 332 and 52 of the embodiment includes one crystal grain that touches the four sides of one of the two surfaces. In the reference MR element, there are variations in the number and size of the crystal grains, as shown in FIG. 27(c) and FIG. 27(d), in the Heusler alloy layers included in the inner layer and the free layer. Therefore, in a strict sense, these two Heusler alloy layers of the reference MR element are different from the Heusler alloy layers 332 and 52 of the embodiment. However, the two Heusler alloy layers of the reference MR element are also indicated with numerals 332 and 52 in the following description for convenience.

Here, the length of a side of the top surface of the larger one of the Heusler alloy layers 332 and 52, that is, the Heusler alloy layer 332, the side extending in the direction parallel to the medium facing surface 20, is defined as an "element width". The length of a side of the top surface of the Heusler alloy layer 332, the side extending in the direction orthogonal to the medium facing surface 20, is defined as an "element height". The area of the top surface of the Heusler alloy layer 332 is defined as an "element area".

In the experiment, the MR ratio was measured for each of the fifty samples of each of the MR elements 5 of the first to sixth examples of the embodiment and the reference MR element. The MR ratio was measured at room temperature (25° C.) wherein the voltage applied to the MR element was 25 mV and the measured magnetic field was −1000 to 10000 Oe (1 Oe=79.6 A/m).

Figure 22:
FIG. 22 is a plot showing the relationship between the resistance and the MR ratio of an MR element of an example of the first embodiment of the invention.
Figure 23:
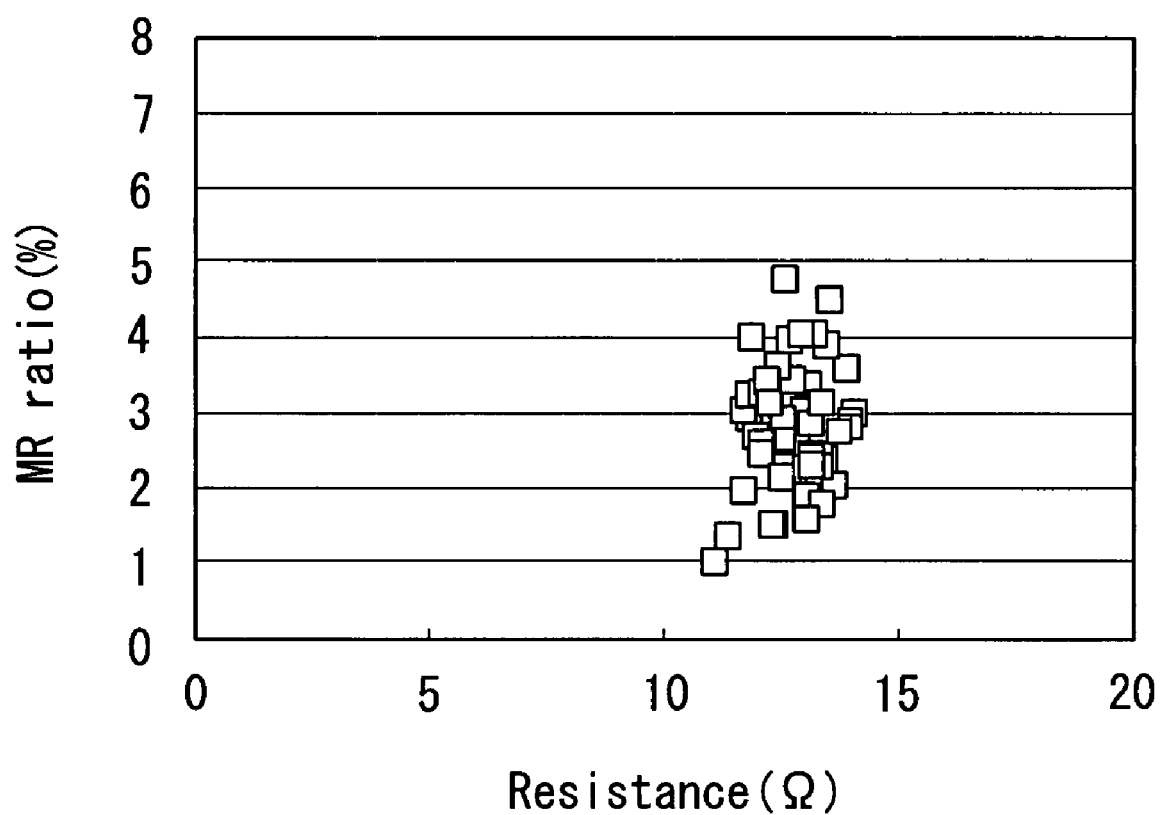
FIG. 23 is a plot showing the relationship between the resistance and the MR ratio of a reference MR element.
Figure 24:
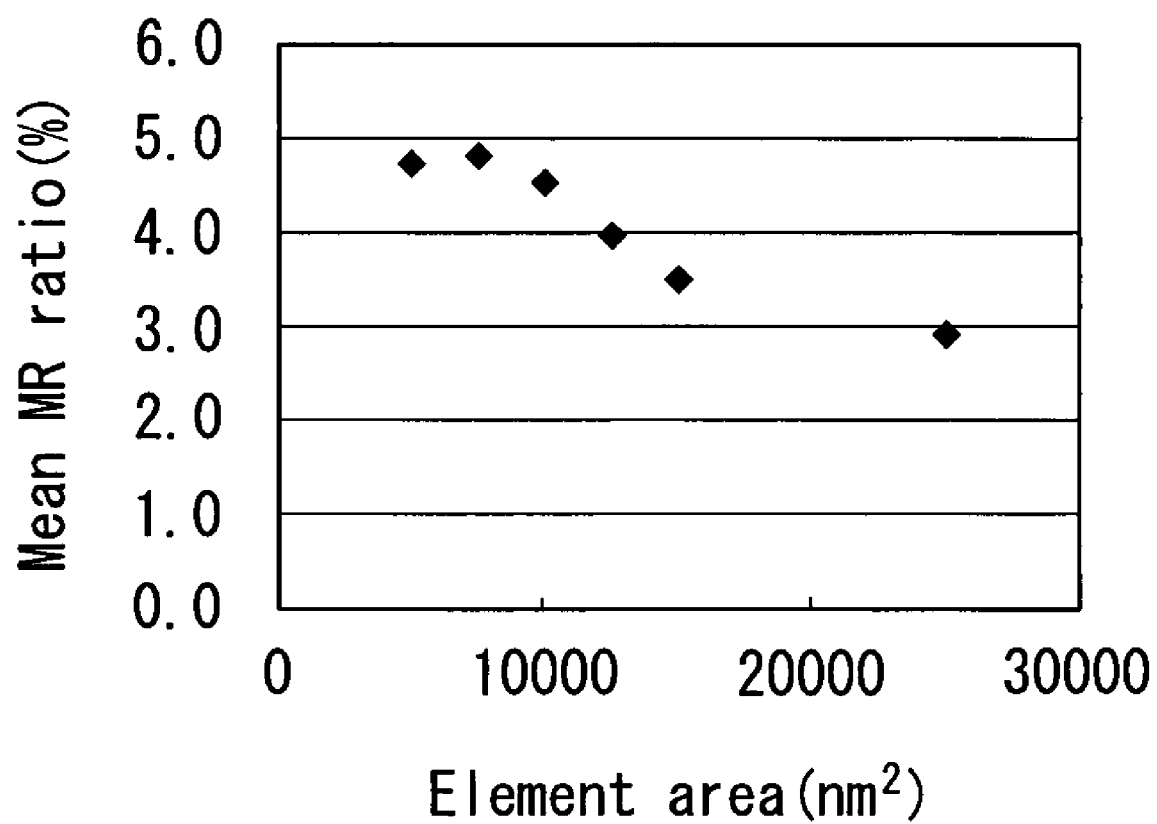
FIG. 24 is a plot showing the relationship between the element area and the mean MR ratio of MR elements of examples of the first embodiment of the invention.
Figure 25:
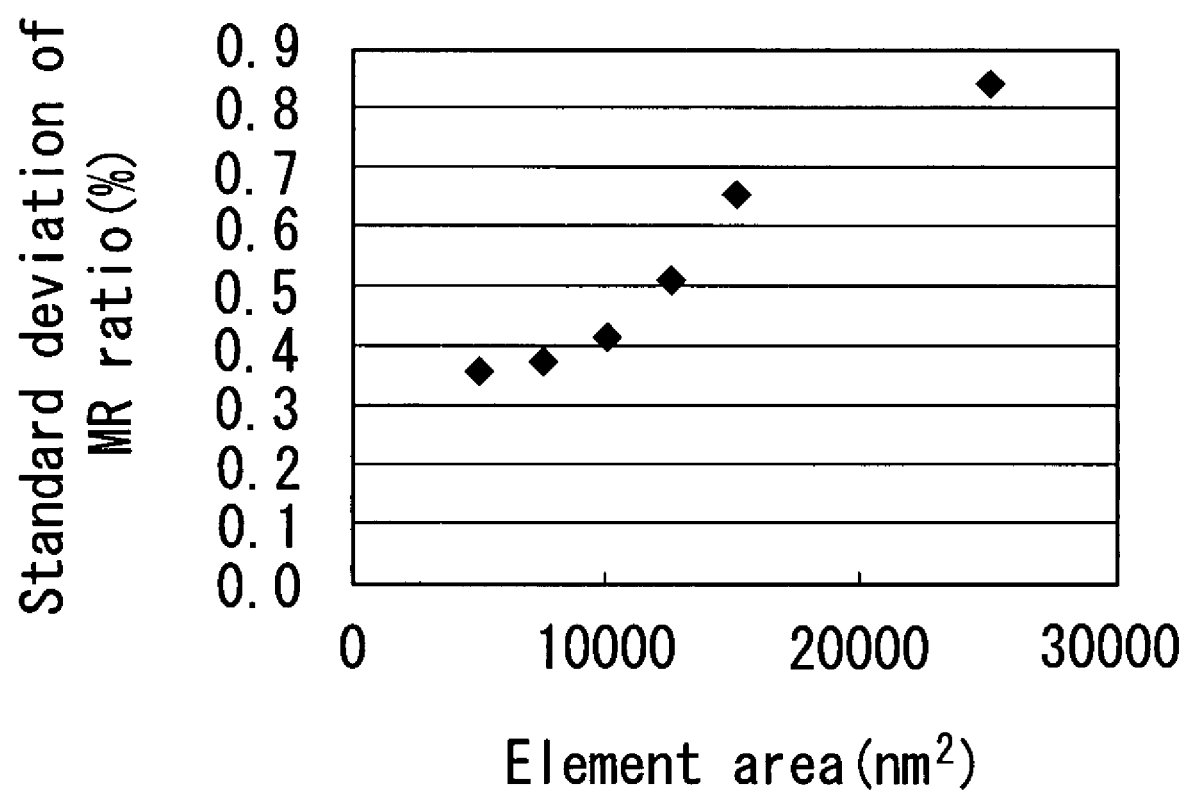
FIG. 25 is a plot showing the relationship between the element area and the standard deviation of the MR ratio of the MR elements of the examples of the first embodiment of the invention.

Table 2 below lists the element width (nm), the element height (nm), the element area ($nm^2$), the mean MR ratio (%), and the standard deviation of the MR ratio (%) for each of the MR elements 5 of the first to sixth examples of the embodiment and the reference MR element. FIG. 22 shows the relationship between the resistance (Ω) and the MR ratio (%) of the MR element 5 of the first example of the embodiment. FIG. 23 shows the relationship between the resistance (Ω) and the MR ratio (%) of the reference MR element. FIG. 24 shows the relationship between the element area ($nm^2$) and the mean MR ratio (%) of the MR element 5 of each of the first to sixth examples of the embodiment. FIG. 25 shows the relationship between the element area ($nm^2$) and the standard deviation of the MR ratio (%) of the MR element 5 of each of the first to sixth examples of the embodiment.

TABLE 2

| | Element width (nm) | Element height (nm) | Element area ($nm^2$) | Mean MR ratio (%) | Standard deviation of MR ratio (%) |
|---|---|---|---|---|---|
| Reference | 50 | 100 | 5000 | 2.73 | 0.88 |
| Example 1 | 50 | 100 | 5000 | 4.73 | 0.36 |
| Example 2 | 50 | 150 | 7500 | 4.81 | 0.37 |
| Example 3 | 50 | 200 | 10000 | 4.53 | 0.42 |
| Example 4 | 50 | 250 | 12500 | 3.97 | 0.51 |
| Example 5 | 50 | 300 | 15000 | 3.50 | 0.65 |
| Example 6 | 50 | 500 | 25000 | 2.91 | 0.84 |

If the reference MR element and the MR element 5 of the first example of the embodiment that have the same shapes are compared with reference to Table 2, FIG. 22 and FIG. 23, the effect of the embodiment is clearly shown. That is, the mean MR ratio of the MR element 5 of the first example is much greater and the standard deviation of the MR ratio thereof is much smaller, compared with the reference MR element. It is assumed that the reason why the mean MR ratio is smaller and the standard deviation of the MR ratio is greater in the reference MR element is that there are variations in the number and size of crystal grains in the Heusler alloy layers 332 and 52 of the reference MR element. In contrast, it is assumed that the reason for the greater mean MR ratio and the smaller standard deviation of the MR ratio in the MR element 5 of the first example is that each of the Heusler alloy layers 332 and 52 of the MR element 5 includes one crystal grain that touches the four sides of one of the two surfaces of the Heusler alloy layer, so that the total surface area of the grain boundaries is reduced and the number and size of the crystal grains are made uniform in the Heusler alloy layers 332 and 52.

Reference is now made to Table 2, FIG. 24 and FIG. 25 to consider preferable ranges of element height and element area of the embodiment. In the first to third examples in which the element height is equal to or smaller than 200 nm, there is no great difference in the mean MR ratio and the standard deviation of the MR ratio. However, in the fourth to sixth examples in which the element height is equal to or greater than 250 nm, the mean MR ratio decreases and the standard deviation of the MR ratio increases as the element height increases. The conceivable reason is that, if the element height is equal to or greater than 250 nm, there may occur cases in which, in the Heusler alloy layers 332 and 52, the maximum diameter of crystal grains that have grown through the heat treatment would not reach the element height. Therefore, from the results of the experiment, it is preferred that the element height be equal to or smaller than 200 nm. In addition, this teaches that a preferable length of the longer sides of one of the two surfaces of each of the Heusler alloy layers 332 and 52 is 200 nm or smaller.

To achieve an areal recording density of 300 gigabits per square inches or greater for a magnetic disk drive, it is expected to be required that the width of the MR element 5 be equal to or smaller than 50 nm. Accordingly, the element width of each of the first to sixth examples of the embodiment was determined to be 50 nm. In the case where the element width is 50 nm, the element area is equal to or smaller than 10000 nm$^2$ if the element height is determined to be equal to or smaller than 200 nm, according to the above-mentioned preferred condition. Also in the case where the element width is smaller than 50 nm, the element area is equal to or smaller than 10000 nm$^2$ if the element height is equal to or smaller than 200 nm. In view of the foregoing, it is preferred that the area of one of the two surfaces of each of the Heusler alloy layers 332 and 52 be equal to or smaller than 10000 nm$^2$.

As described so far, according to the MR element 5, the magnetoresistive element aggregate or the thin-film magnetic head of the embodiment, since the pinned layer 23 includes the Heusler alloy layer 332 and the free layer 25 includes the Heusler alloy layer 52, it is possible to obtain a high MR ratio for the MR element 5 resulting from a high spin polarization of the Heusler alloy layers 332 and 52. Furthermore, according to the embodiment, since each of the Heusler alloy layers 332 and 52 includes one crystal grain that touches the four sides of one of the two surfaces thereof, it is possible to reduce variations in characteristics of the MR element 5 such as the MR ratio.

According to the method of manufacturing the MR element 5 of the embodiment, since the pinned layer 23 includes the Heusler alloy layer 332 and the free layer 25 includes the Heusler alloy layer 52 in the MR element 5 to be manufactured, it is possible to obtain a high MR ratio for the MR element 5 resulting from a high spin polarization of the Heusler alloy layers 332 and 52. Furthermore, according to the method of manufacturing the MR element 5 of the embodiment, since each of the Heusler alloy layers 332 and 52 is made to include one crystal grain that touches the four sides of one of the two surfaces thereof, it is possible to reduce variations in characteristics of the MR element 5 such as the MR ratio.

In the embodiment, each of the pinned layer 23 and the free layer 25 includes the Heusler alloy layer. However, only one of the pinned layer 23 and the free layer 25 may include the Heusler alloy layer. The above-described effects are achieved in this case, too.

Figure 5:
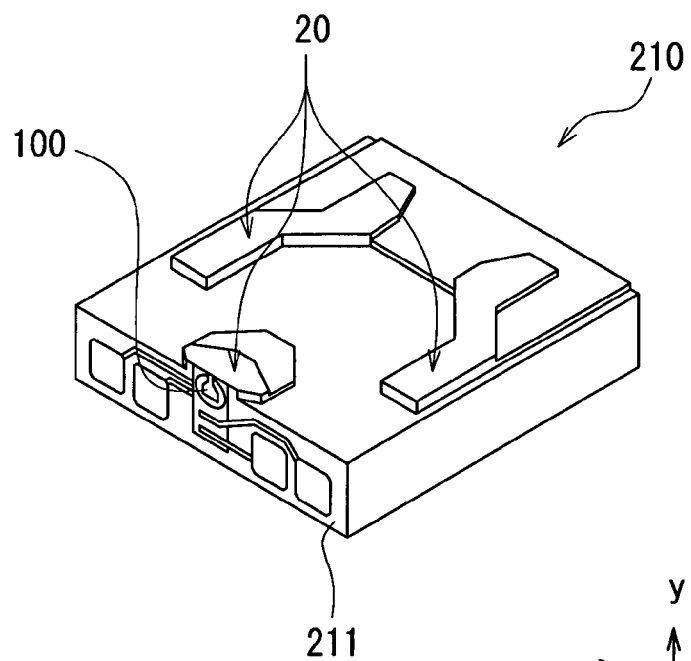
FIG. 5 is a perspective view illustrating a slider incorporated in a head gimbal assembly of the first embodiment of the invention.

A head gimbal assembly, a head arm assembly and a magnetic disk drive of the embodiment will now be described. Reference is made to FIG. 5 to describe a slider 210 incorporated in the head gimbal assembly. In the magnetic disk drive the slider 210 is placed to face toward a magnetic disk platter that is a circular-plate-shaped recording medium to be driven to rotate. The slider 210 has a base body 211 made up mainly of the substrate 1 and the overcoat layer 17 of FIG. 3. The base body 211 is nearly hexahedron-shaped. One of the six surfaces of the base body 211 faces toward the magnetic disk platter. The medium facing surface 20 is formed in this one of the surfaces. When the magnetic disk platter rotates in the z direction of FIG. 5, an airflow passes between the magnetic disk platter and the slider 210, and a lift is thereby generated below the slider 210 in the y direction of FIG. 5 and exerted on the slider 210. The slider 210 flies over the magnetic disk platter by means of the lift. The x direction of FIG. 5 is across the tracks of the magnetic disk platter. A thin-film magnetic head 100 of the embodiment is formed near the air-outflow-side end (the end located at the lower left of FIG. 5) of the slider 210.

Figure 6:
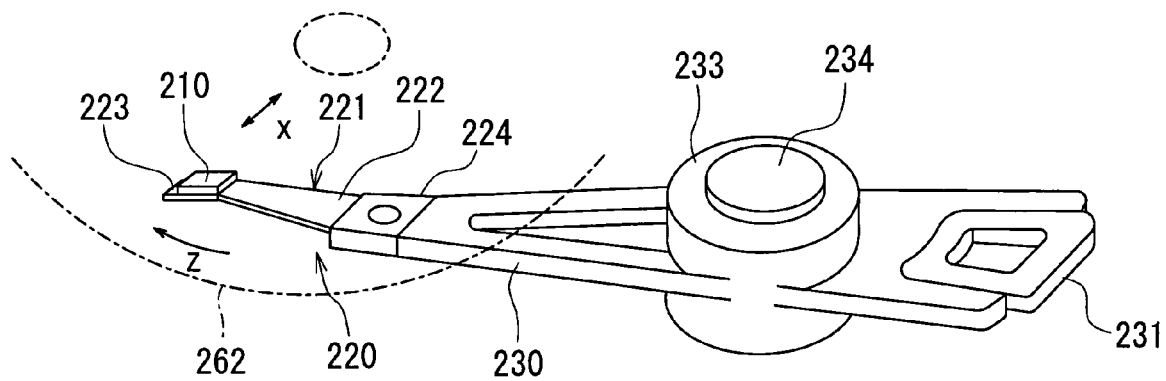
FIG. 6 is a perspective view illustrating a head arm assembly of the first embodiment of the invention.

Reference is now made to FIG. 6 to describe the head gimbal assembly 220 of the embodiment. The head gimbal assembly 220 incorporates the slider 210 and a suspension 221 that flexibly supports the slider 210. The suspension 221 incorporates: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of the magnetic disk platter 262. The actuator incorporates the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly comprising the arm 230 and the head gimbal assembly 220 attached to the arm 230 is called a head arm assembly. An assembly comprising a carriage having a plurality of arms wherein the head gimbal assembly 220 is attached to each of the arms is called a head stack assembly.

FIG. 6 illustrates the head arm assembly of the embodiment. In the head arm assembly the head gimbal assembly 220 is attached to an end of the arm 230. A coil 231 that is part of the voice coil motor is fixed to the other end of the arm 230. A bearing 233 is provided in the middle of the arm 230. The bearing 233 is attached to an axis 234 that rotatably supports the arm 230.

Figure 7:
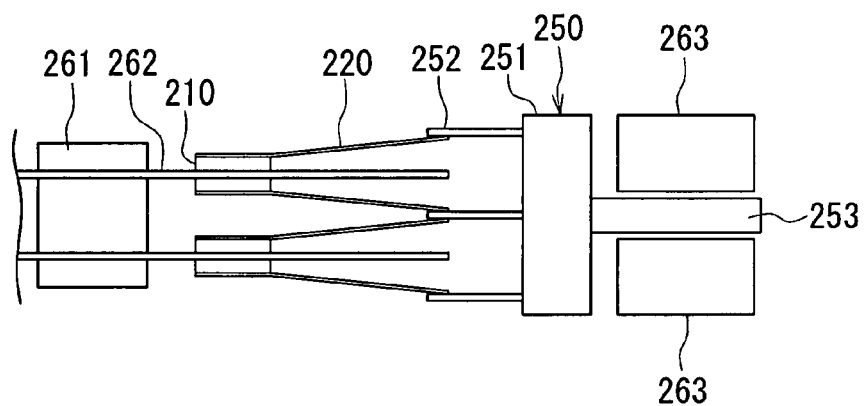
FIG. 7 is a view for illustrating the main part of a magnetic disk drive of the first embodiment of the invention.
Figure 8:
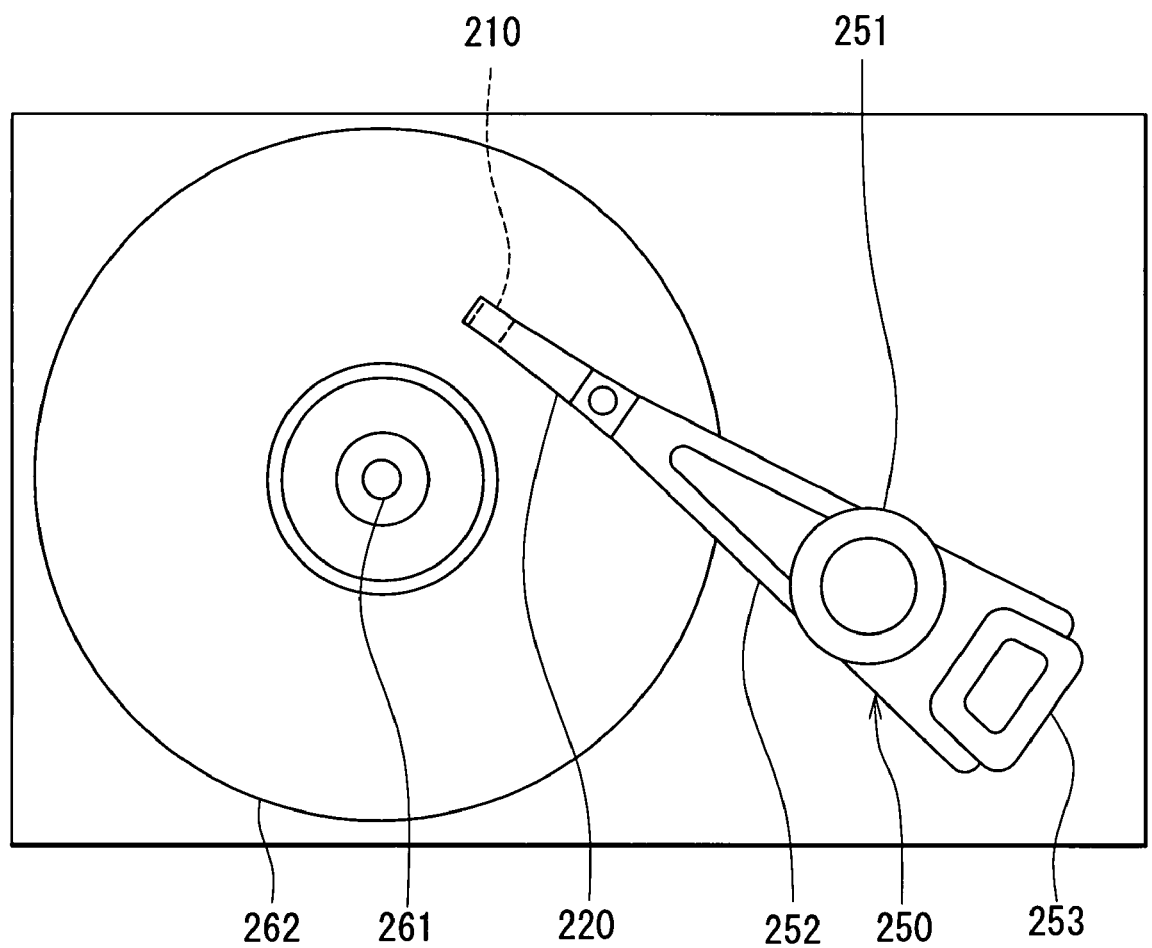
FIG. 8 is a top view of the magnetic disk drive of the first embodiment of the invention.

Reference is now made to FIG. 7 and FIG. 8 to describe an example of the head stack assembly and the magnetic disk drive of the embodiment. FIG. 7 illustrates the main part of the magnetic disk drive. FIG. 8 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other, the coil 253 of the head stack assembly 250 being placed between the magnets 263.

The actuator and the head stack assembly 250 except the sliders 210 correspond to the alignment device of the invention and support the sliders 210 and align them with respect to the magnetic disk platters 262.

In the magnetic disk drive of the embodiment the actuator moves the slider 210 across the tracks of the magnetic disk platter 262 and aligns the slider 210 with respect to the magnetic disk platter 262. The thin-film magnetic head incorporated in the slider 210 writes data on the magnetic disk platter 262 through the use of the write head and reads data stored on the magnetic disk platter 262 through the use of the read head.

The head gimbal assembly, the head arm assembly and the magnetic disk drive of the embodiment exhibit effects similar to those of the foregoing thin-film magnetic head of the embodiment.

Second Embodiment

Figure 26:
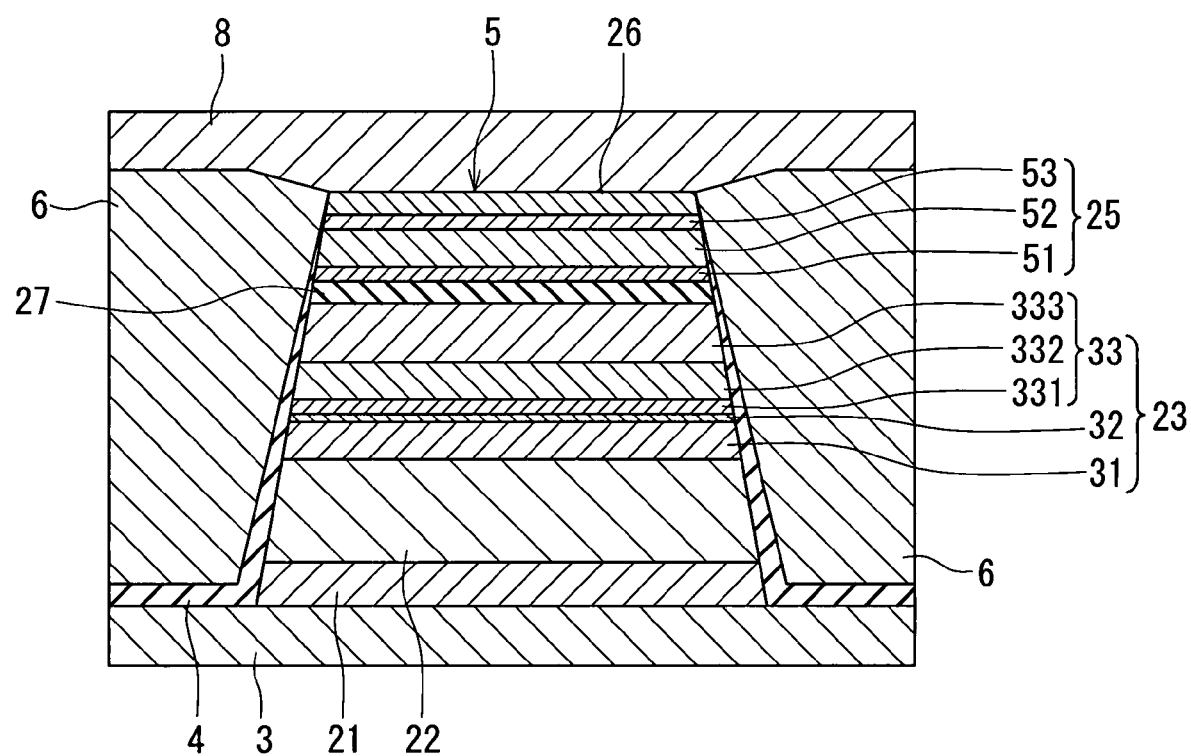
FIG. 26 is a cross-sectional view of a read head of a second embodiment of the invention, wherein the cross section is parallel to the medium facing surface.

A second embodiment of the invention will now be described. FIG. 26 is a cross-sectional view of a read head of the second embodiment, wherein the cross section is parallel to the medium facing surface. As shown in FIG. 26, the MR element 5 of the second embodiment has such a configuration that a tunnel barrier layer 27 made of a nonmagnetic insulating layer is provided in place of the nonmagnetic conductive layer 24 of the first embodiment. That is, the MR element 5 of the second embodiment is a TMR element. The tunnel barrier layer 27 is such a layer that electrons are allowed to pass therethrough while maintaining the spin by the tunnel effect. The tunnel barrier layer 27 has a thickness of 0.5 to 2 nm, for example. The tunnel barrier layer 27 may be made of nitride or oxide of Al, Ni, Gd, Mg, Ta, Mo, Ti, W, Hf or Zr, for example. The tunnel barrier layer 27 corresponds to the nonmagnetic layer of the invention. In the second embodiment, as in the first embodiment, a sense current is fed to the MR element 5 in a direction intersecting the plane of each layer making up the MR element 5, such as the direction perpendicular to the plane of each layer making up the MR element 5.

In the second embodiment, as in the first embodiment, it is possible to increase the MR ratio of the MR element 5 that is a TMR element since the spin polarization of the Heusler alloy layers 332 and 52 is high.

The remainder of configuration, function and effects of the second embodiment are similar to those of the first embodiment.

The present invention is not limited to the foregoing embodiments but may be practiced in still other ways. In the invention, for example, the pinned layer 23 is not limited to a synthetic pinned layer.

While the thin-film magnetic head disclosed in the embodiments has such a configuration that the read head is formed on the base body and the write head is stacked on the read head, it is also possible that the read head is stacked on the write head.

If the thin-film magnetic head is dedicated to reading, the thin-film magnetic head may have a configuration incorporating a read head only.

The magnetoresistive element of the invention can be used not only for a read head of a thin-film magnetic head but also for other applications such as a magnetic sensor.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a magnetoresistive element, the magnetoresistive element comprising: a nonmagnetic layer having a first surface and a second surface that face toward opposite directions; a pinned layer disposed adjacent to the first surface of the nonmagnetic layer, a direction of magnetization in the pinned layer being fixed; and a free layer disposed adjacent to the second surface of the nonmagnetic layer, a direction of magnetization in the free layer changing in response to an external magnetic field, wherein a current for detecting magnetic signals is fed in a direction intersecting a plane of each of the forgoing layers, at least one of the pinned layer and the free layer includes a Heusler alloy layer made of a Heusler alloy and having two surfaces that are quadrilateral in shape and face toward opposite directions, and the Heusler alloy layer includes one crystal grain that touches four sides of one of the two surfaces of the Heusler alloy layer, the method comprising the steps of:

forming a layered film that will be the magnetoresistive element after undergoing patterning and heat treatment, the layered film including a film to be the pinned layer, a film to be the nonmagnetic layer, and a film to be the free layer, wherein at least one of the film to be the pinned layer and the film to be the free layer includes a film to be the Heusler alloy layer;

patterning the layered film so that the film to be the Heusler alloy layer has two surfaces that are quadrilateral in shape and face toward opposite directions; and performing the heat treatment on the layered film after the step of patterning, so that crystal grains included in the film to be the Heusler alloy layer grow and one crystal grain that touches four sides of one of the two surfaces of the film to be the Heusler alloy layer is thereby formed.

2. The method according to claim 1, wherein the one of the two surfaces of the Heusler alloy layer is rectangular in shape, and a longer one of the sides of the one of the two surfaces has a length equal to or smaller than 200 nm.

3. The method according to claim 2, wherein the one of the two surfaces of the Heusler alloy layer has an area equal to or smaller than 10000 $nm^2$.

4. The method according to claim 1, wherein the nonmagnetic layer is made of a conductive material.

5. The method according to claim 1, wherein the nonmagnetic layer is a tunnel barrier layer made of an insulating material.

* * * * *